United States Patent
Sterzel et al.

(10) Patent No.: US 7,952,015 B2
(45) Date of Patent: May 31, 2011

(54) PB-TE-COMPOUNDS DOPED WITH TIN-ANTIMONY-TELLURIDES FOR THERMOELECTRIC GENERATORS OR PELTIER ARRANGEMENTS

(75) Inventors: Hans-Josef Sterzel, Dannstadt-Schauernheim (DE); Klaus Kuehling, Ellerstadt (DE); Mercouri G. Kanatzidis, Okemos, MI (US); Duck-Young Chung, Haslett, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 811 days.

(21) Appl. No.: 11/392,495

(22) Filed: Mar. 30, 2006

(65) Prior Publication Data

US 2007/0227577 A1    Oct. 4, 2007

(51) Int. Cl.
H01L 35/16    (2006.01)
(52) U.S. Cl. ............ 136/238; 136/236.1; 136/205; 136/203; 136/201; 136/200; 438/54
(58) Field of Classification Search ............... 136/238, 136/239, 240
See application file for complete search history.

(56) References Cited

U.S. PATENT DOCUMENTS

| | | |
|---|---|---|
| 2,811,440 A | 10/1957 | Fritts et al. |
| 2,811,571 A | 10/1957 | Fritts et al. |
| 2,811,720 A | 10/1957 | Fritts et al. |
| 2,882,468 A | 4/1959 | Wernick |
| 2,944,404 A | 7/1960 | Fritts |
| 2,949,014 A | 8/1960 | Belton, Jr. et al. |
| 3,004,393 A | 10/1961 | Alsing |
| 3,006,979 A | 10/1961 | Rich |
| 3,071,495 A | 1/1963 | Hanlein |
| 3,073,883 A | 1/1963 | McHugh et al. |
| 3,129,116 A | 4/1964 | Corry |
| 3,178,895 A | 4/1965 | Mole et al. |
| 3,213,630 A | 10/1965 | Mole |
| 3,224,876 A | 12/1965 | Fredrick |
| 3,238,134 A | 3/1966 | Fleischmann |

(Continued)

FOREIGN PATENT DOCUMENTS

DE    101 42 624 A1    4/2003

(Continued)

OTHER PUBLICATIONS

Borissova et al., Thermoelectric properties of materials based on PbTe and GeTe, 1$^{st}$ Eur. Conf. Thermoelec., Cardiff, Sep. 15-17, 1987, Chapter 15, pp. 171-177 (1988).

(Continued)

*Primary Examiner* — Jennifer K Michener
*Assistant Examiner* — Jayne Mershon
(74) *Attorney, Agent, or Firm* — Knobbe, Martens, Olson & Bear, LLP

(57) ABSTRACT

The invention relates to a thermoelectrically active p- or n-conductive semiconductor material constituted by a compound of the general formula (I)

$$(PbTe)_{1-x}(Sn_{2+y}Sb_{2+z}Te_5)_x \qquad (I)$$

with $0.0001 \leq x \leq 0.5$, $0 \leq y < 2$ and $0 \leq z < 2$, wherein 0 to 10% by weight of the compound may be replaced by other metals or metal compounds, wherein the semiconductor material has a Seebeck coefficient of at least $|S| \geq 60\,\mu V/K$ at a temperature of 25° C. and electrical conductivity of at least 150 S/cm and power factor of at least $5\,\mu W/(cm \cdot K^2)$, further relates to a process for the preparation of such semiconductor materials, as well as to generators and Peltier arrangements containing them.

29 Claims, 14 Drawing Sheets

U.S. PATENT DOCUMENTS

| | | | |
|---|---|---|---|
| 3,318,669 A | 5/1967 | Folberth | |
| 3,505,728 A | 4/1970 | Hare et al. | |
| 3,527,621 A | 9/1970 | Newton | |
| 3,527,622 A | 9/1970 | Angus et al. | |
| 3,607,444 A | 9/1971 | Debucs | |
| 3,626,704 A | 12/1971 | Coe, Jr. | |
| 3,635,037 A | 1/1972 | Hubert | |
| 3,663,307 A | 5/1972 | Mole | |
| 3,681,929 A | 8/1972 | Schering | |
| 3,779,814 A | 12/1973 | Miles et al. | |
| 3,817,043 A | 6/1974 | Zoleta | |
| 3,859,143 A | 1/1975 | Krebs | |
| 3,945,855 A | 3/1976 | Skrabek et al. | |
| 4,038,831 A | 8/1977 | Gaudel et al. | |
| 4,065,936 A | 1/1978 | Fenton et al. | |
| 4,281,516 A | 8/1981 | Berthet et al. | |
| 4,297,841 A | 11/1981 | Cheng | |
| 4,420,940 A | 12/1983 | Buffet | |
| 4,494,380 A | 1/1985 | Cross | |
| 4,499,329 A | 2/1985 | Benicourt et al. | |
| 4,608,319 A | 8/1986 | Croopnick et al. | |
| 4,730,459 A | 3/1988 | Schlicklin et al. | |
| 4,731,338 A | 3/1988 | Ralston et al. | |
| 4,905,475 A | 3/1990 | Tuomi | |
| 4,989,626 A | 2/1991 | Takagi et al. | |
| 5,006,178 A | 4/1991 | Bijvoets | |
| 5,038,569 A | 8/1991 | Shirota et al. | |
| 5,092,129 A | 3/1992 | Bayes et al. | |
| 5,097,829 A | 3/1992 | Quisenberry | |
| 5,193,347 A | 3/1993 | Apisdorf | |
| 5,228,923 A | 7/1993 | Hed | |
| 5,232,516 A | 8/1993 | Hed | |
| 5,385,020 A | 1/1995 | Gwilliam et al. | |
| 5,429,680 A | 7/1995 | Fuschetti | |
| 5,439,528 A | 8/1995 | Miller | |
| 5,448,109 A | 9/1995 | Cauchy | |
| 5,499,504 A | 3/1996 | Mill et al. | |
| 5,584,183 A | 12/1996 | Wright et al. | |
| 5,592,363 A | 1/1997 | Atarashi et al. | |
| 5,594,609 A | 1/1997 | Lin | |
| 5,605,047 A | 2/1997 | Park et al. | |
| 5,682,748 A | 11/1997 | DeVilbiss et al. | |
| 5,726,381 A | 3/1998 | Horio et al. | |
| 5,802,856 A | 9/1998 | Schaper et al. | |
| 5,860,472 A | 1/1999 | Batchelder | |
| 5,867,990 A | 2/1999 | Ghoshal | |
| 5,900,071 A | 5/1999 | Harman | |
| RE36,242 E | 6/1999 | Apisdorf | |
| 5,921,088 A | 7/1999 | Imaizumi et al. | |
| 5,955,772 A | 9/1999 | Shakouri et al. | |
| 5,959,341 A | 9/1999 | Tsuno et al. | |
| 5,966,941 A | 10/1999 | Ghoshal | |
| 5,987,890 A | 11/1999 | Chiu et al. | |
| 6,000,225 A | 12/1999 | Ghoshal | |
| 6,013,204 A | 1/2000 | Kanatzidis et al. | |
| 6,060,657 A | 5/2000 | Harman | |
| 6,082,445 A | 7/2000 | Dugan | |
| 6,084,172 A | 7/2000 | Kishi et al. | |
| 6,096,966 A | 8/2000 | Nishimoto et al. | |
| 6,103,967 A | 8/2000 | Cauchy et al. | |
| 6,225,550 B1 | 5/2001 | Hornbostel et al. | |
| 6,274,802 B1 | 8/2001 | Fukuda et al. | |
| 6,282,907 B1 | 9/2001 | Ghoshal | |
| 6,312,617 B1 | 11/2001 | Kanatzidis et al. | |
| 6,319,744 B1 | 11/2001 | Hoon et al. | |
| 6,334,311 B1 | 1/2002 | Kim et al. | |
| 6,346,668 B1 | 2/2002 | McGrew | |
| 6,347,521 B1 | 2/2002 | Kadotani et al. | |
| 6,366,832 B2 | 4/2002 | Lomonaco et al. | |
| 6,367,261 B1 | 4/2002 | Marshall et al. | |
| 6,401,462 B1 | 6/2002 | Bielinski | |
| 6,412,287 B1 | 7/2002 | Hughes et al. | |
| 6,444,894 B1 | 9/2002 | Sterzel | |
| 6,446,442 B1 | 9/2002 | Batchelor et al. | |
| 6,452,206 B1 | 9/2002 | Harman et al. | |
| 6,477,844 B2 | 11/2002 | Ohkubo et al. | |
| 6,481,213 B2 | 11/2002 | Carr et al. | |
| 6,510,696 B2 | 1/2003 | Guttman et al. | |
| 6,530,231 B1 | 3/2003 | Nagy et al. | |
| 6,530,842 B1 | 3/2003 | Wells et al. | |
| 6,539,725 B2 | 4/2003 | Bell | |
| 6,560,968 B2 | 5/2003 | Ko | |
| 6,563,039 B2 | 5/2003 | Caillat et al. | |
| RE38,128 E | 6/2003 | Gallup et al. | |
| 6,617,504 B2 | 9/2003 | Kajihara et al. | |
| 6,625,990 B2 | 9/2003 | Bell | |
| 6,637,210 B2 | 10/2003 | Bell | |
| 6,672,076 B2 | 1/2004 | Bell | |
| 6,812,395 B2 | 11/2004 | Bell | |
| 6,845,710 B2 | 1/2005 | Hinzpeter et al. | |
| 6,858,154 B2 | 2/2005 | Suzuki et al. | |
| 6,883,359 B1 | 4/2005 | Hartwig, Jr. | |
| 6,948,321 B2 | 9/2005 | Bell | |
| 6,959,555 B2 | 11/2005 | Bell | |
| 7,111,465 B2 | 9/2006 | Bell | |
| 7,231,772 B2 | 6/2007 | Bell | |
| 7,273,981 B2 | 9/2007 | Bell | |
| 7,326,851 B2 | 2/2008 | Sterzel et al. | |
| 7,342,169 B2 | 3/2008 | Venkatasubramanian et al. | |
| 7,365,265 B2 | 4/2008 | Heremans et al. | |
| 7,426,835 B2 | 9/2008 | Bell | |
| 7,465,871 B2 | 12/2008 | Chen et al. | |
| 2001/0029974 A1 | 10/2001 | Cohen et al. | |
| 2003/0094265 A1 | 5/2003 | Chu et al. | |
| 2004/0200519 A1 | 10/2004 | Sterzel et al. | |
| 2004/0261829 A1 | 12/2004 | Bell | |
| 2004/0261833 A1 | 12/2004 | Ono et al. | |
| 2005/0076944 A1 | 4/2005 | Kanatzidis et al. | |
| 2005/0241690 A1* | 11/2005 | Tajima et al. | 136/212 |
| 2006/0102224 A1 | 5/2006 | Chen et al. | |
| 2006/0249704 A1 | 11/2006 | Ren et al. | |
| 2006/0272697 A1 | 12/2006 | Kanatzidis et al. | |
| 2007/0107764 A1* | 5/2007 | Kanatzidis et al. | 136/205 |
| 2007/0227577 A1 | 10/2007 | Sterzel et al. | |
| 2008/0289677 A1 | 11/2008 | Bell et al. | |
| 2009/0178700 A1 | 7/2009 | Heremans et al. | |
| 2009/0235969 A1 | 9/2009 | Heremans et al. | |
| 2009/0269584 A1 | 10/2009 | Bell et al. | |
| 2010/0258154 A1 | 10/2010 | Heremans et al. | |

FOREIGN PATENT DOCUMENTS

| | | |
|---|---|---|
| EP | 1 102 334 A2 | 5/2001 |
| GB | 2 027 534 | 2/1980 |
| GB | 2 267 338 | 12/1993 |
| JP | 56-18231 | 2/1981 |
| JP | 4-165234 | 6/1992 |
| JP | 5-219765 | 8/1993 |
| JP | 09-074229 | 3/1997 |
| JP | 2000-164940 | 6/2000 |
| JP | 2002-289930 | 10/2002 |
| JP | 2003-225743 | 8/2003 |
| JP | 2008-523579 | 12/2006 |
| SE | 329 870 | 10/1970 |
| SE | 337 227 | 5/1971 |
| WO | WO 98/44562 | 10/1998 |
| WO | WO 00/24040 | 4/2000 |
| WO | WO 02/065030 | 8/2002 |
| WO | WO 2004/090998 | 10/2004 |
| WO | WO 2005/036660 | 4/2005 |
| WO | WO 2009/091747 | 7/2009 |
| WO | WO 2009/094571 | 7/2009 |
| WO | WO 2009/132314 | 10/2009 |

OTHER PUBLICATIONS

Lawson et al., Preparation and properties of HgTe and mixed crystals of HgTe-CdTe, Phys. and Chem. Solids, 9, pp. 325-329 (1959) (abstract only).

Wernick, Metallurgy of some ternary semiconductors and constitution on the AgSbSe2-AgSbTe2-AgBiSe-PbSe-PbTe system, Bell Telephone Laboratories, Inc., Murray Hill, New Jersey, pp. 69-88 (1960).

Ahmad, S., et al.: "Ab initio studies of the electric structure of defects in PbTe" Physical Review B, vol. 74, 2006, pp. 155205-1-155205-13, XP002554793 cited in the application paragraphs [III.A.4], [III.B.2], [III.B.3]; figure 2a.

Akimov, B. A., et al.: "Carrier Transport and Non-Equilibrium Phenomena in Doped PbTe and Related Materials" Review Article, Departmen of Low Temperature Physics, Faculty of Physics, M.V. Lomonossov Moscow State University, phys. stat. sol. (a) 127, 9 (1993) (pp. 9-55).

Androulakis, John et al.,: "Nanostructuring and High Thermoelectric Efficiency in p-Type Ag(Pb1-ySny) mSbTe2+m" Wiley InterScience, Advanced Materials, 2006, 18, 1170-1173, Wiley-VCH Verlag GmbH & Co. KGaA, Weinheim.

Angrist, S. W., "Direct Energy Conversion", 3rd Edition, Ed. Ally & Bacon (1976).

Armstrong, R. W., et al.: "A Structural Study of the Compound AgSbTe$_2$", Journal of Applied Physics, vol. 31, No. 11, Nov. 1960, pp. 1954-1959.

Bazakutsa, V. A., et al.: "Thermal Conductivity of Triple Semiconductors of A$^1$SbC Type as a Function of Chemical Composition and Structure", J. Eng. Phys. 34, 127-140 (1978).

Bell, L. E.: "Alternate Thermoelectric Thermodynamic Cycles with Improved Power Generation Efficiencies", Proceedings ICT '03, 22nd International Conference on Thermoelectrics, La Grande Motte, France, Aug. 17-21, 2003.

Bell, L. E., "Increased Thermoelectric System Thermodynamic Efficiency by Use of Convective Heat Transport," Proc. 21st Int'l Conf. on Thermolectrics, Long Beach, CA (Aug. 2002).

Bell, L. E., "Use of Thermal Isolation to Improve Thermoelectric System Operating Efficiency," Proc. 21st Int'l Conf. on Thermoelectrics, Long Beach, CA (Aug. 2002).

Bergmann, V. G.: "Untersuchungen über die Dotierungseigenschaften der Elemente Germanium und Blei in Wismuttellurid Bi$_2$Te$_3$*", Z. Ruer Naturforsch, vol. 18a, Issue 11, 1963, pp. 1169-1181.

Buist, R., et al. "Theoretical Analysis of Thermoelectric Cooling Performance Enhancement Via Thermal and Electrical Pulsing", Journal of Thermoelectricity, No. 4, 1996.

Buist, R.J.. et al. "A New Concept for Improving Thermoelectric Heat Pump Efficiency", Borg-Warner Thermoelectrics Wolf and Algonquin Road, pp. 60-63, 1976.

Bushmarina, G. S., et al.: "Stabilization of the Fermi level in gallium-doped Pb$_{1-x}$Ge$_x$Te solid solutions", Sov. Phys. Semicond. 11(10), Oct. 1977, American Institute of Physics 1978, pp. 1098-1102.

Caillat, T. et al.: "Study of the Bi-Sb-Te Ternaru Phase Diagram", J. Phys. Chem. Solids vol. 53, No. 2, pp. 227-232, 1992.

Chinese Office Action for CN App. No. 200680019992.6 dated Nov. 6, 2009.

Choi, J.-S. et al., "Thermoelectric Properties of n-Type (Pbl-xGex)Te Fabricated by Hot Pressing Method" Proc. 16th International Conference on Thermoelectrics, 228-231. (1997).

CRC Handbook of Thermoelectrics, ed. D.M. Rowe, Chapter 54, Medium-Scale Cooling: Thermoelectrice Technology and Chap. 55, Modeling of Thermoelectric Cooling Systems, (ISBN: 0-8493-0146-7), Jul. 1995, pp. 667-683.

Derwent 2001-426994/46.

DeYoreo et al., Principles of Crystal Nucleation and Growth, Biomineralization, vol. 54, Weiner Mineralogical Society of America, pp. 57-93, 2003.

Dismukes, J.P. et al.: "Lattice Parameter and Density in Germanium-Silicon Alloys", RCA Laboratories, Radio Corporation of America, Princeton, New Jersey, vol. 68, No. 10, Oct. 1964, pp. 3021-3027.

EPO Examination Report for EPO App. No. 04 726 474.2-1235, dated Nov. 28, 2007 in 6 pages.

Fleischmann, V. H., et al.: "Halbleitende Mischkristalle vom Typ", Z. Naturforschg. 14a, 999-1000 (1959); eingeg. am Oct. 8, 1950).

Fleischmann, V. H., et al.: "Neuere Untersüchungen an halbleitenden IV VI-IV VI$_2$-Mischkristallen", Z. Naturforschg. JBa, 646-649 (1969); eingegangen am Mar. 9, 1963).

Gelbstein Y., et al.: "In-doped Pb0.5Sn0.5Te p-type samples prepared by powder metallurgical processing for thermoelectric applications" Physica B, vol. 396, Jan. 1, 2007 pp. 16-21, XP002554792 figure 11.

Geller, S., et al.: "Ternary Semiconducting Compounds with Sodium Chloride-Like Structure: AgSbSe$_2$, AgSbTe$_2$, AgBiS$_2$, AgBiSe$_2$", Ternary Semiconducting Compounds, Acta Cryst. (1959) 12, pp. 46-54.

Goldsmid, H.J., "Electronic Refrigeration", Pion Ltd, 207 Brondesbury Park, London (1986).

Golubev, V. G., et al.: "Electrical properties of Pb$_{1-x}$In$_x$Te solid solutions at liquid helium temperature", Sov. Phys. Semicond. 11(9) Sep. 1977, American Institute of Physics 1978, pp. 1001-1003.

Goodman, C.H.L., et al.: "New Semiconducting Compounds of Diamond Type Structure", Research Laboratories the General Electric Co. Ltd., Wembley, Middlesex, England, Physica XX, No. 11, Amsterdam Conference Semiconductors (1954) pp. 1107-1109.

Guéguen, A., et al.: "Thermoelectric Properties and Nanostructuring in the p-Type Materials NaPb18-xSnxMTe20 (M=Sb, Bi)", Chem. Mater. 2009, 21, 1683-1694 © American Chemical Society.

Heremans, et al.: "Thermopower enhancement in PbTe with Pb precipitates", Journal of Applied Physics 98, 063703 (2005).

Heremans, J. P., et al.: "Enhancement of Thermoelectric Efficiency in PbTe by Distortion of the Electric Density of States", Science 321, 554 (2008), in six pages.

Hoang, Khang, et al.: "Atomic Ordering and Gap Formation in Ag-Sb-Based Ternary Chalcogenides" Physical Review Letters, American Physical Society, New York, US, vol. 99, No. 15, Oct. 12, 2007 pp. 156403-1, XP007910508 ISSN: 0031-9007.

Hockings, E.F.: "The thermal conductivity of silver antimony telluride", Letters to the Editors, 1959, pp. 341-342.

Hsu, K.F. et al.: "Cubic AgPbmSbTe2+m: bulk thermoelectric materials with high figure of merit" Science, vol. 303, Feb. 6, 2004, pp. 818-821 XP002555879.

Hsu, K.F. et al.: "Thermoelectric Properties of the cubic AgPb10SbTe12" Mat. Res. Soc. Symp. Proc. vol. 793 © 2004 Materials Research Society, pp. S6.3.1-S6.3.6.

Ikoma, K., et al., "Thermoelectric Module and Generator for Gasoline Engine Vehicles," 17th Int'l Conf. on Thermo-electrics, Nagoya, Japan,pp. 464-467 (1998).

International Preliminary Report on Patentability for PCT/US06/021630 mailed May 9, 2008 in 6 pgs.

International Search Report and Written Opinion for PCT/US2009/030868, dated Dec. 8, 2009.

International Search Report and Written Opinion for PCT/US2009/031875, dated Dec. 10, 2009.

International Search Report for PCT/EP2004/03786 mailed Oct. 18, 2004 in 3 pgs.

International Search Report for PCT/US 02/03654 mailed on Jun. 12, 2002 (completion date May 20, 2002).

International Search Report for PCT/US 02/03659 mailed on Aug. 6, 2002 (completion date Jul. 9, 2002).

International Search Report for PCT/US 02/06285 mailed on Jun. 12, 2002 (completion date May 11, 2002).

International Search Report for PCT/US 02/25233 mailed on Nov. 29, 2002 (completion date Sep. 24, 2002).

International Search Report for PCT/US 03/17834 mailed on Sep. 2, 2003 (completion date Jul. 29, 2003).

International Search Report for PCT/US02/03772 mailed Jul. 11, 2002 (completion date May 29, 2002).

International Search Report for PCT/US03/24899; mailed May 18, 2005 (completion date Apr. 5, 2004).

International Search Report for PCT/US04/026560; dated Nov. 25, 2004.

International Search Report for PCT/US04/026757; mailed Apr. 13, 2005 (completeion date Apr. 7, 2005).

International Search Report for PCT/US06/021630 mailed Oct. 25, 2007 in 1 pg.

Japanese Office Action for JP 2008-515793 dated Oct. 2, 2009.

Jaworski, C. M., et al.: "Resonant level formed by tin in Bi$_2$Te$_3$ and the enhancement of room-temperature thermoelectric power", Physical Review B 80, 1 (2009), pp. 1-1 to 1-4.

Jaworski, C. M., et al.: "Tin in Bi$_2$Te$_3$: Resonant Level?", Ohio State University, Dept of Mechanical Engineering and Dept of Physics, Moscow State University, Low Temperature Physics Dept., 1961 to 2004.

Jaworski, C. M.: "An Investigation into Lead Telluride Lead Sulfide Composites and Bismuth tin Telluride Alloys for Thermoelectric Applications", Thesis presented in the Graduate School of the Ohio State University, Dec. 2008.

Jovovic, V., et al.: "High-Temperature Thermoelectric and Thermomagnetic Properties of $Pb_{1-x}Sn_xTe:In$", The Ohio State University, Columbus, OH 43210, USA, 2008, 6 pages.

Jovovic, V., et al.: "Low temperature thermal, thermoelectric and thermomagnetic transport in indium rich $Pb_{1-x}Sn_xTe$ alloys", The Ohio State University, Columbus, OH 43210, USA, 2008, 7 pages.

Jovovic, V.: "Galvanomagnetic and thermomagnetic properties of $AgSbTe_2$", Meeting of the American Physical Society, 2007.

Kaïdanov, V. I., et al.: "Deep and resonance states in $A^{IV}B^{VI}$ semiconductors", Sov. Phys. Usp. 28(1), Jan. 1985, American Institute of Physics 1985, pp. 31-53.

Kaïdanov, V. I., et al.: "Influence of resonant scattering of carriers on the transport coefficients in the absence of a magnetic field", Sov. Phys. Semicond. 20(6), Jun. 1986, American Institute of Physics 1986, pp. 693-694.

Kaïdanov, V. I., et al.: "New quasilocal level in PbTe:Tl containing excess lead", Sov. Phys. Semicond. 20(5), May 1986, American Institute of Physics 1986, pp. 541-543.

Kaïdanov, V. I., et al.: "Resonant scattering of carriers in IV-VI semiconductors", Sov. Phys. Semicond. 26(2), Feb. 1992, American Institute of Physics 1992, pp. 113-125.

Kohler, H.: "Non-Parabolicity of the Highest Valence Band of Bi2Te3 from Shubnikov-de Haas Effect". Physikalisches Institut der Universtat Wurzburg, phys. stat. sol (b) 74, 591 (1976) pp. 591-600.

Kohri H., et al., "Improvement of thermoelectric properties for n-type PbTe by adding Ge" Materials Science Forum Trans Tech Publications Switzerland, vol. 423-425, 2003, pp. 381-384, XP008035344.

Kulbachinskii, V. A., et al.: "Thermoelectric Power and Scattering of Carriers in $Bi_{2-x}Sn_xTe_3$ with Layered Structure", phys. Stat. sol. (b) 199, 505 (1997).

Kulbachinskii, V. A., et al.: "Valence-band energy spectrum of solid solutions of narrow-gap-semiconuctor $Bi_{2-x}S_xTe_3$ single crystals", Physical Review B, vol. 50, No. 23, Dec. 15, 1994, pp. 16 921-16 930.

Kullerud, The Lead Sulfur System, American Journal of Science, Schairer vol. 267-A, pp. 233-256, 1969.

Lashkaraev G. V., et al., "Hot wall growth and properties of lead telluride films doped by germanium and gallium" Semiconductor Physics Quantum Electronics & Optoelectronics Natl. Acad. Sci. UKR Ukraine, vol. 3, No. 3, Jun. 2000, pp. 295-299, XP002296047 Ukraine ISSN: 1560-8034.

Long, C., et al: "Preparation and thermoelectric properties of N-type PbTe doped with In and PbI2" Rogl, P. F.,: 25th International Conference on Thermoelectrics, Aug. 6-10, 2006 (IEEE Cat. No. 06TH8931C) Piscataway, NJ, USA ISBN 1-4244-0811-3: , Aug. 10, 2006, XP002556257 p. 382-385.

Mahan, G. D., et al.: "The best thermoelectric", Proc. Natl. Acad. Sci. USA, vol. 93, pp. 7436-7439, Applied Physical Sciences, Jul. 1996.

Middendorf von, A., et al.: "Evidence for a Second Valence Band in $p$-Type $Bi_2Te_3$ From Magneto-Seebeck and Shubnikov-De Haas-Data", Physikalisches Institut der universität Würzburg, Würzburg-,Germany, Mar. 30, 1072, in five pages.

Miner, A., et al. "Thermo-Electro-Mechanical Refrigeration Based on Transient Thermoelectric Effects", Applied Physics letters, vol. 75, pp. 1176-1178 (1999).

Miyajima, N., et al.: "Possible Mechanism of a New Type of Three-Dimensional Quantized Hall Effect in Layered Semiconductors $Bi_{2-x}Sn_xTe_3$", Journal of Low Temperature Physics, Vo. 123, Nos. ¾, 2001, pp. 219-238.

Morelli, D.T., et al. "Intrinscally minimal thermal conductivity of AgSbTe2", Dept. of Chemical Engineering and Materials Science, Michigan State University, East Lansing, Michigan, 2008, 16 pages.

Nemov, S. A. et al.: "Density of Localized States in $(Pb_{0.78}Sn_{0.22})$ $0.95In_{0.05}Te$ Solid Solutions", Electronic and Optical Properties of Semiconductors, Semiconductors, vol. 35, No. 10, 2001, pp. 1144-1146.

Nemov, S. A., et al.: "Characteristics of the energy spectrum of $Pb_{1-x}Sn_xTe:Tl:Na$" M. I. Jalinin Polytechnic Instutitute Leningrad, Sov. Phys. Semicond. 24(8), Aug. 1990, pp. 873-876.

Nemov, S. A., et al.: "Self-compensation of electrically active impurities by intrinsic defects in $(Pb_{0.8}Sn_{0.2})$ Te solid solutions" State Technical University, St. Petersburg, A.F. Ioffe Physicotechnical Institute, Russian Academy of Sciences, St. Petersburg, Sov. Phys. Semicond. 26(8), Aug. 1992, pp. 839-842.

Nemov, S. A., et al.: "Transport phenomena in $Pb_{0.78}Sn_{0.22}Te$ with high In impurity concentrations", Semiconductors 27(2), Feb. 1993, American Institute of Physics 1993, pp. 165-168.

Partin, D.L., "Growth of lead-germanium-telluride thin film structures by molecular beam epitaxy" J. Vac. Sci. Technol., 21(1), May/Jun. 1982, p. 1-5.

Plecháček, T., et al.: "Defect structure of Pb-doped $Bi_2Te_3$ single crystals", Philosophical Magazine, vol. 84, No. 21, Jul. 21, 2004, pp. 2217-2227.

Poudeu, P. F., et al.: "High temperature figure of merit and naostructuring in bulk p-type NaI-xPbmSbyTem+2" vol. 45, 2006, pp. 3835-3839, XP002555880.

Quarez, Eric et al., "Nanostructuring, Compositional Fluctuations, and Atomic Ordering in the Thermoelectric Materials AgPbmSbTe2+m. The Myth of Solid Solutions" Journal of the American Chemical Society, American Chemical Society, Washington, DC, US, vol. 127, Jan. 1, 2005 pp. 9177-9190, XP007910505 ISSN:0002-7863.

Ravich et al., "Semiconducting Lead Chalcogenides," Chap. IV, Sec. 4.2, pp. 196-213, 1970.

Ravich, Y. I., et al.: "Selective Carrier Scattering in Thermoelectric Materials", Ch. 7, CRC Handbook of Thermoelectrics, D.M. Rowe, Editor, CRC Press, Inc. Boca-Raton FL, 1995 pp. 67-73.

Rogacheva, E. I., et al., "Concentration anomalies of properties in Pb1-xGexTe solid solutions" XP002296049 Database accession No. 4554393 abstract & XXII International School on Physics of Semiconducting Compounds May 22-28, 1993 Jaszowiec, Poland, vol. 84, No. 4, May 22, 1992, pp. 729-732, Acta Physica Polonica A Poland ISSN: 0587-4246 (The Institution of Electrical Engineers, Stevenage, GB; Oct. 1993.

Rosi, F. D., et al.: "Semiconducting materials for thermoelectric power generation" RCA Review, vol. 22, Mar. 1, 1961, pp. 82-121, XP008114961 RCA Corporation, US ISSN: 0033-6831 cited in the application p. 104-p. 110.

Scherrer, H., et al.: "Thermoelectric Materials", Bismuth Telluride, Antimony Telluride, and Their Solid Solutions, Chapter 19, 1995, pp. 211-255.

Shoemake, G. E., et al.: "Specific Heat of $n$- and $p$-Type $Bi_2Te_3$ from 1.4 to 90°K*", Physical Review, vol. 185, No. 3, Sep. 15, 1969, pp. 1046-1056.

Tada, S., et al., "A New Concept of Porous Thermoelectric Module Using a Reciprocating Flow for Cooling/Heating Systems (Numerical Analysis for Heating Systems)" 16th International Conference on Thermoelectrics (1977).

Veĭs A. N. et al: "Investigation of the impurity states of thallium lead selenide", Sov. Phys. Semicond., vol. 11, No. 5, May 1977, American Institute of Physics 1977, pp. 588-589.

Volkov, B. A., et al.: "Mixed-valence impurities in lead telluride-based solid solutions", Physics-Uspekhi 45 (8) 819-846 (2002), Uspekhi Fizicheskikh Nauk, Russian Academy of Sciences 2002.

Wernick, J. H., et al.: "New semiconducting ternary compounds", Phys. Chem. Solids 3, Letters to the Editor, 1957, pp. 157-159.

Wolfe, R., et al.: "Anomalous Hall Effect in $AgSbTe_2$", Journal of Applied Physics, vol. 31, No. 11, Nov. 1960, pp. 1959-1964.

Wood, C., et al.: "Review Article; Materials for thermoelectric energy conversion" Reports on Progress in Physics, Institute of Physics Publishing, Bristol, GB, vol. 51, No. 4, Apr. 1, 1988 pp. 459-539, XP020024916 ISSN: 0034-4885 pp. 496,499; figure 18.

Zhitinskaya, M. K., et al.: "Influence of Sn Resonance States on the Electrical Homogeneity of $Bi_2Te_3$ Single Crystals", Semiconductors, vol. 34, No. 12, 2000, pp. 1363-1364.

Zhitinskaya, M. K., et al.: "Properties of the Electron and Phonon Sub-systems of Tin-doped Bismuth Telluride-based Solid Solutions", 7th European Workshop on Thermoelectrics, 2002, Pamplona, Spain, 5 pages.

Zhitinskaya, M. K., et al.: "Specific features of $Bi_2Te_3$ doping with Sn", Physics of the Solid State, vol. 40, No. 8, Aug. 1998, pp. 1297-1300.

Zhitinskaya, M. K., et al.: "Thermal Conductivity of $Bi_2Te_3$: Sn and the Effect of Codoping by Pb and I Atoms", Physics of the Solid State, vol. 45, No. 7, 2003, pp. 1251-1253.

Zhuze, V. P., et al.: "Semiconducting Compounds With the General Formula ABX$_2$", Soviet Physics, Technical Physics, vol. 3, No. 10, Oct. 1958, pp. 1925-1938.

ДуДКИН, Л. Ц. et al.: "ТРОЙНЫЕ ПОЛУПРОВОДНИКОВЫЕ СОЕДНЕНИЯ A$^1$B$^V$B$^V_2$$^1$", Доклаыы АкаДеМИИ Наук СССР, 1959. Том 124, No. 1, pp. 94-97.

Alekseeva, G. T., et al.: "Hole Concentration and Thermoelectric Figure of Merit for Pb1-xSnxTe: Te Solid Solutions", Semiconductors, vol. 34, No. 8, 2000, pp. 897-901. Translated from Fizika I Tekhnika Poluprovodnikov, vol. 34, No. 8, 2000, pp. 935-939.

Darrow, M.S., et al.: "Phase Relations in the System PBS-PbTe", Transactions of the Metallurgical Society of AIME, 654-vol. 236, May 1996.

Dimmock, J. O., et al.: "Band Structure and Laser Action in PbxSn1-xTe" Physical Review Letters, vol. 16, No. 26, pp. 1193-1196 , Jun. 27, 1996.

Dughaish, Z. H.: "Lead telluride as a thermoelectric material for thermoelectric power generation", Physica B 322 (2002) 205-223.

Ebling, et al.: "Influence of Group IV-Te Alloying oj Nanocomposite Structure and Thermoelectric Properties of Bi2 Te3 Compounds", Journal of Electronic Materials, vol. 38, No. 7, 2009, pp. 1450-1455.

Jaworski, C.M., et al.: "Resonant level formed by tin in Bi2Te3 and the enhancement of room-temperature thermoelectric power", Physical Review B 80, 233201 (2009), pp. 1-4.

Kudman, I.: "Thermoelectric properties of p-tupe PbTe-PbSe alloys", Journal of Materials Science 7 (1972) 1027-1029.

Kulbachinskiĭa, et al.: "Fermi Surface and Thermoelectric Power of (Bi1-xSBx)2Te3<Ag,Sn> Mixed Crystals", in Fizika Tverdogo Tela, 2006, vol. 48, No. 5, pp. 594-601.

Lalonde, A.D., et al.: "Synthesis and Characterization of p-Type Pb0.5 Sn0.5Te Thermoelectric Power Generation Elements by Mechanical Alloying," Journal of Electronic Materials, vol. 39, No. 1, 2010.

Matsushita, et al.: "Phase diagram and thermoelectric properties of Ag 3-xSb1+xTe4 system", Journal of Materials Science 39 (2004) 6299-6301.

McGraw Hill online Science dictionary "shearing stress" downloaded from www.accessscience.com on Aug. 2, 2010.

Orihashi, M., et al.: "Effect of tin content on thermoelectric properties of p-type lead tin telluride," Journal of Physics and Chemistry of Solids 61 (2000) 919-923.

Ravich, Y. I., et al.: "Applications of Lead Chalcogenides", Semiconducting Lead Chalcogenides, 1970 Chapter VII, Sec. 7.1, pp. 328, 329.

Shamsuddin et al.: "Thermodynamic and Constitutional Studies of the Pb Te-GeTe System", Journal of Materials Science, vol. 10, pp. 1849-1855, 1975.

Stambaugh, et al.: "Final Summary Report on Development on Improved Thermoelectric Materials for Spacegraft Applications", Battele Memorial Institute, Contract No. NAS8-11452, Control No. DCN 1-4-50-01159-01 & S1 (1F), dated Jun. 25, 1965.

* cited by examiner

Figure 1/1
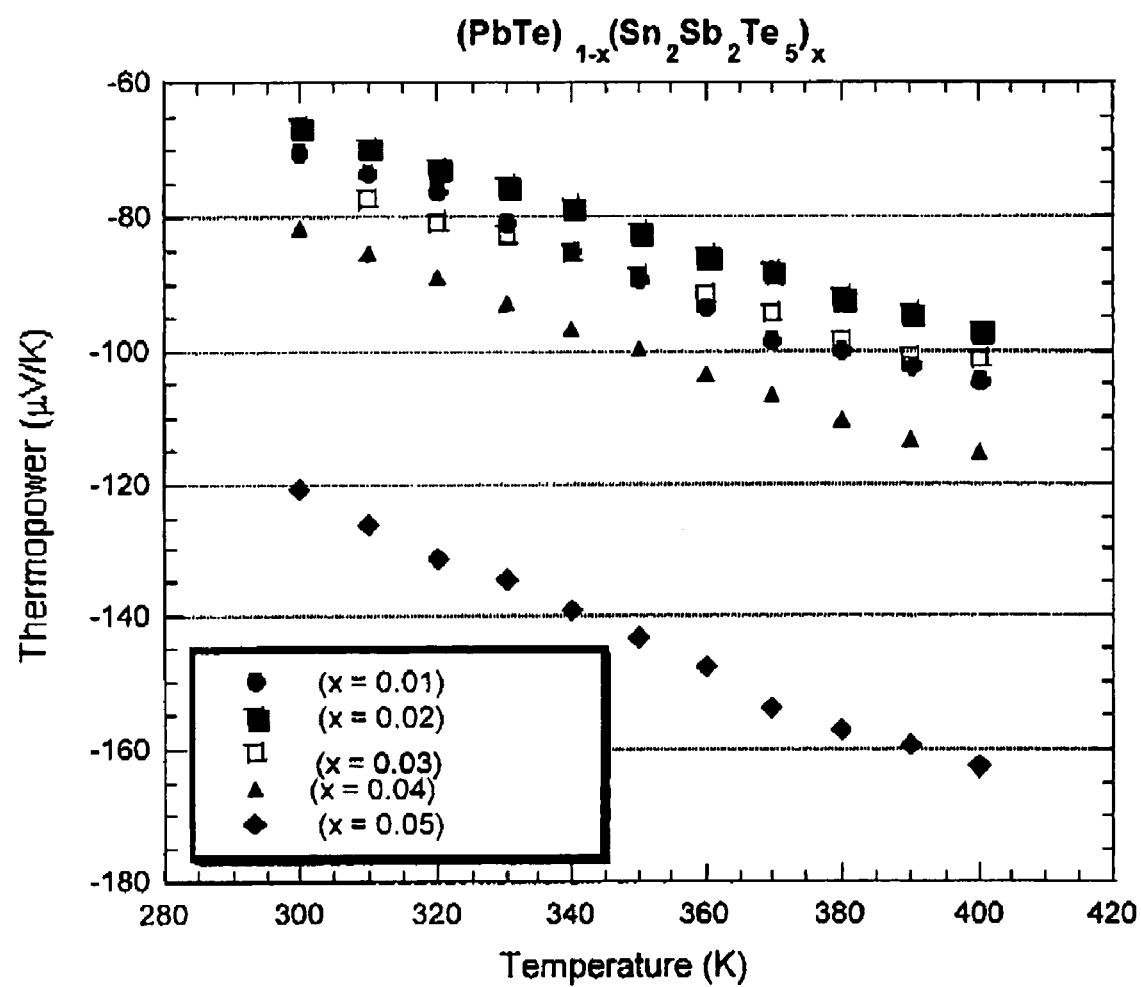

Figure 1/2: High Temperature Measurements
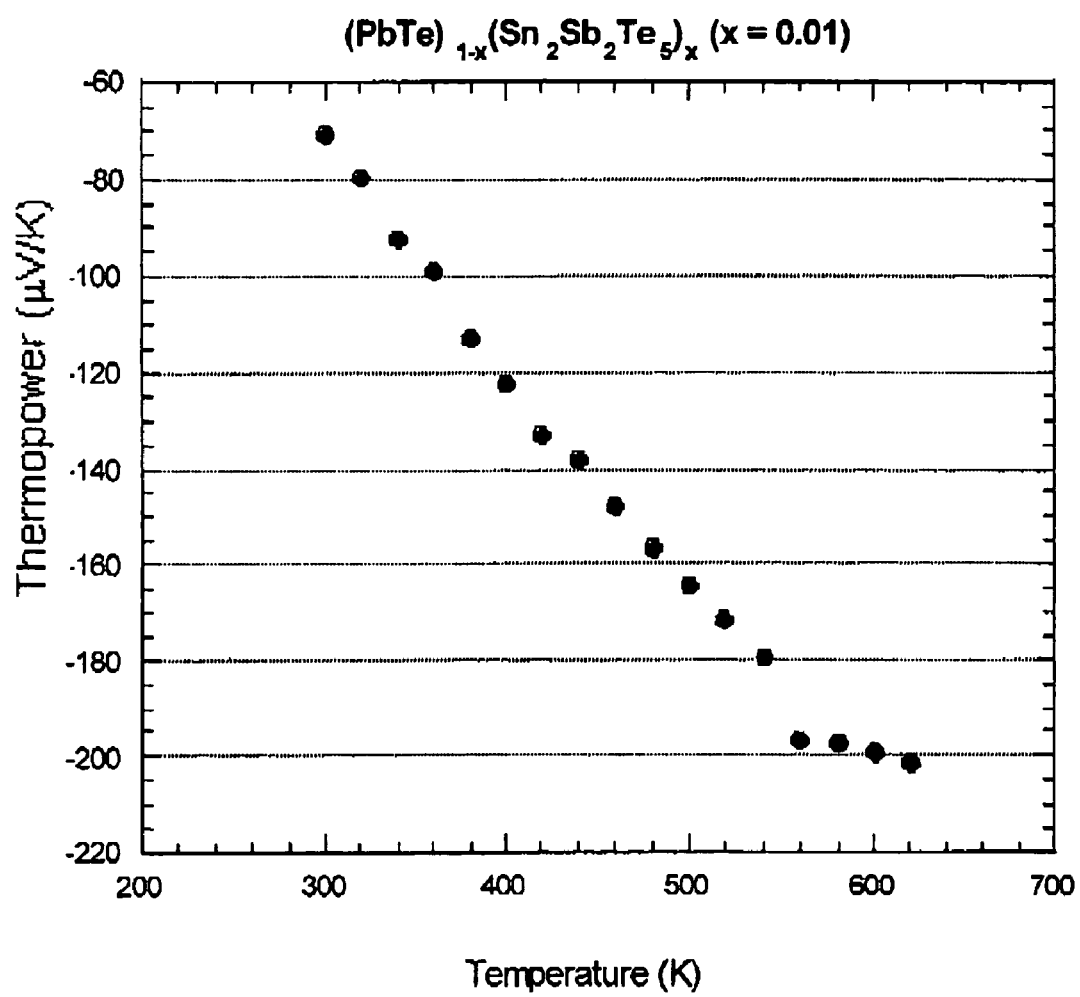

Figure 2/1:
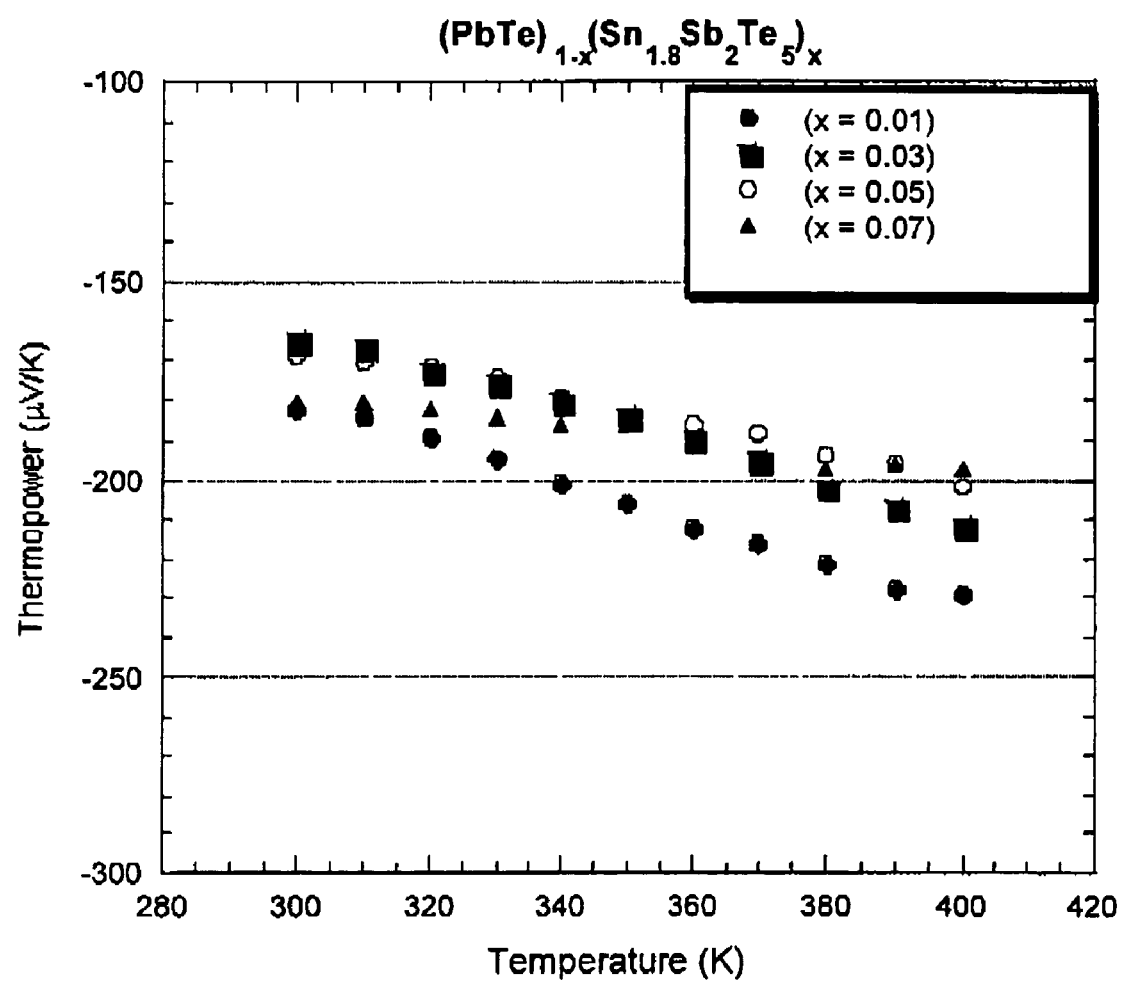

Figure 2/2: High Temperature Measurements
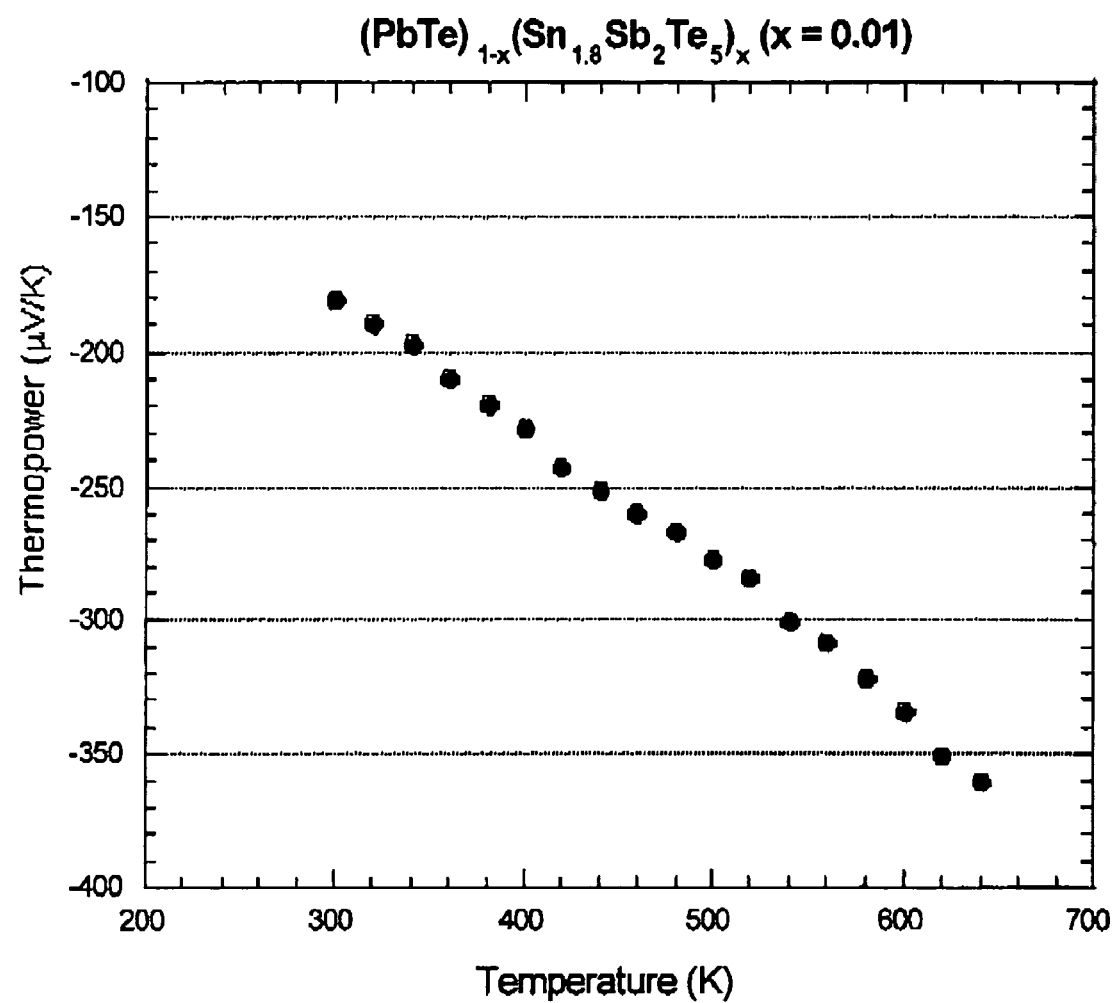

Figure 3/1
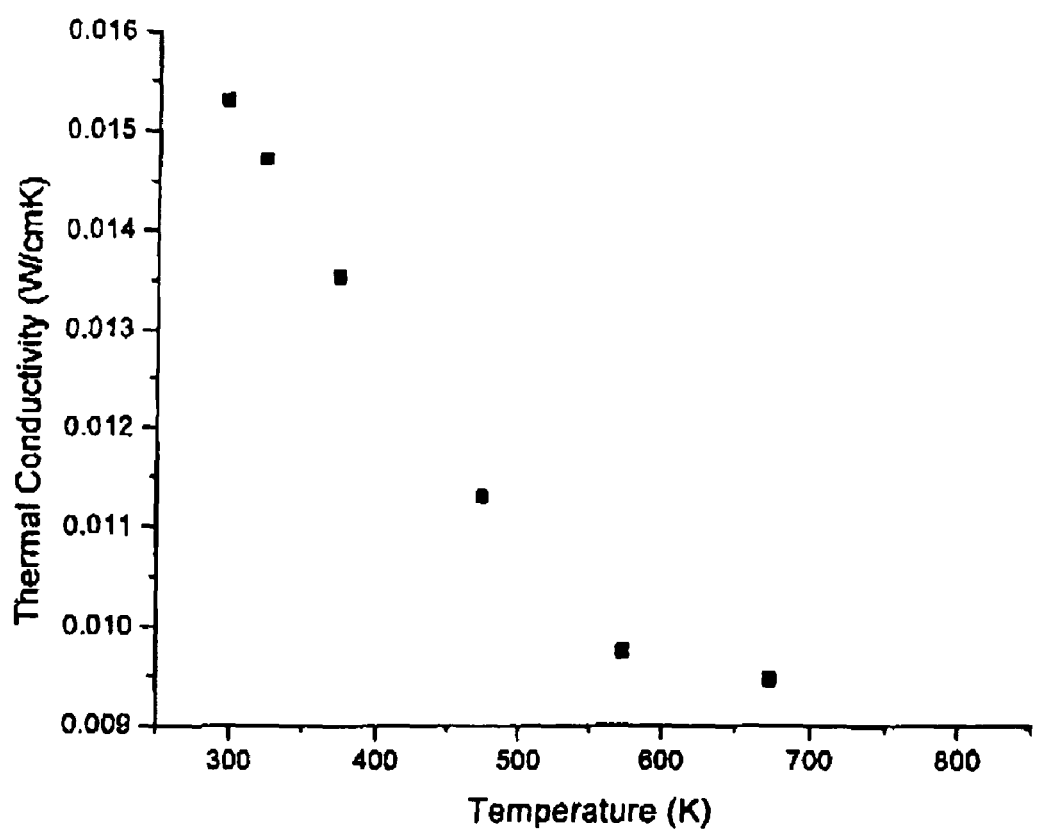

Figure 3/2
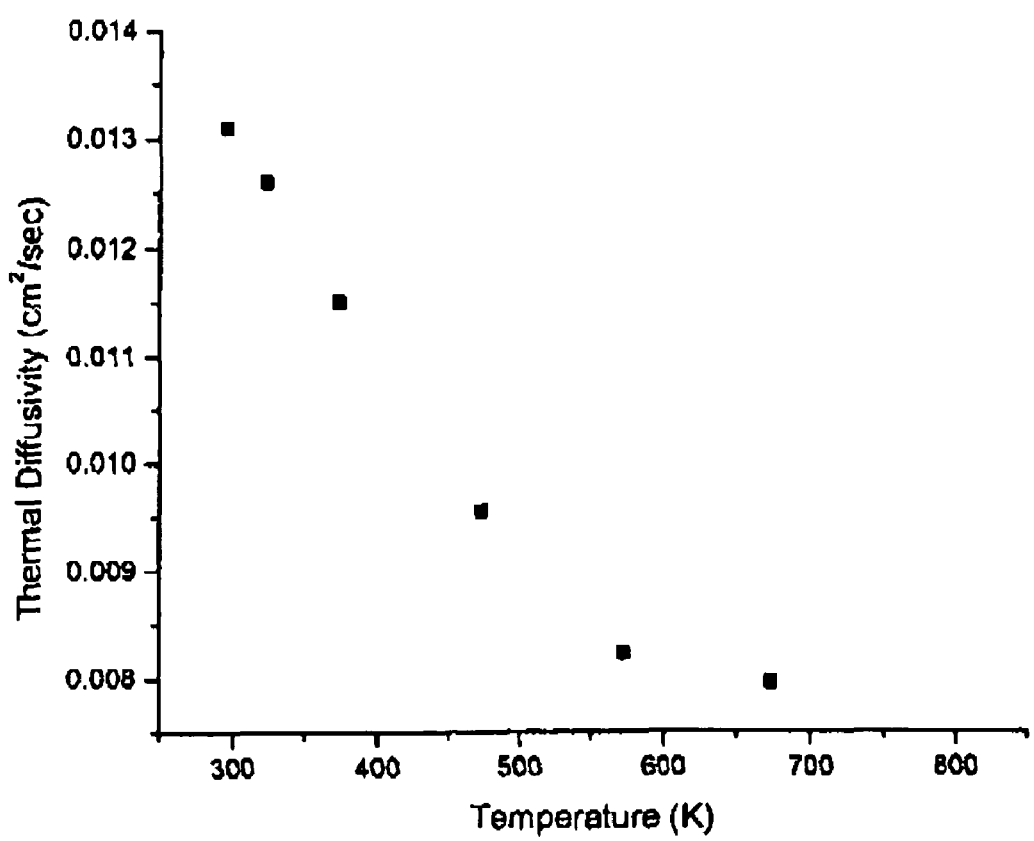

Figure 3/3
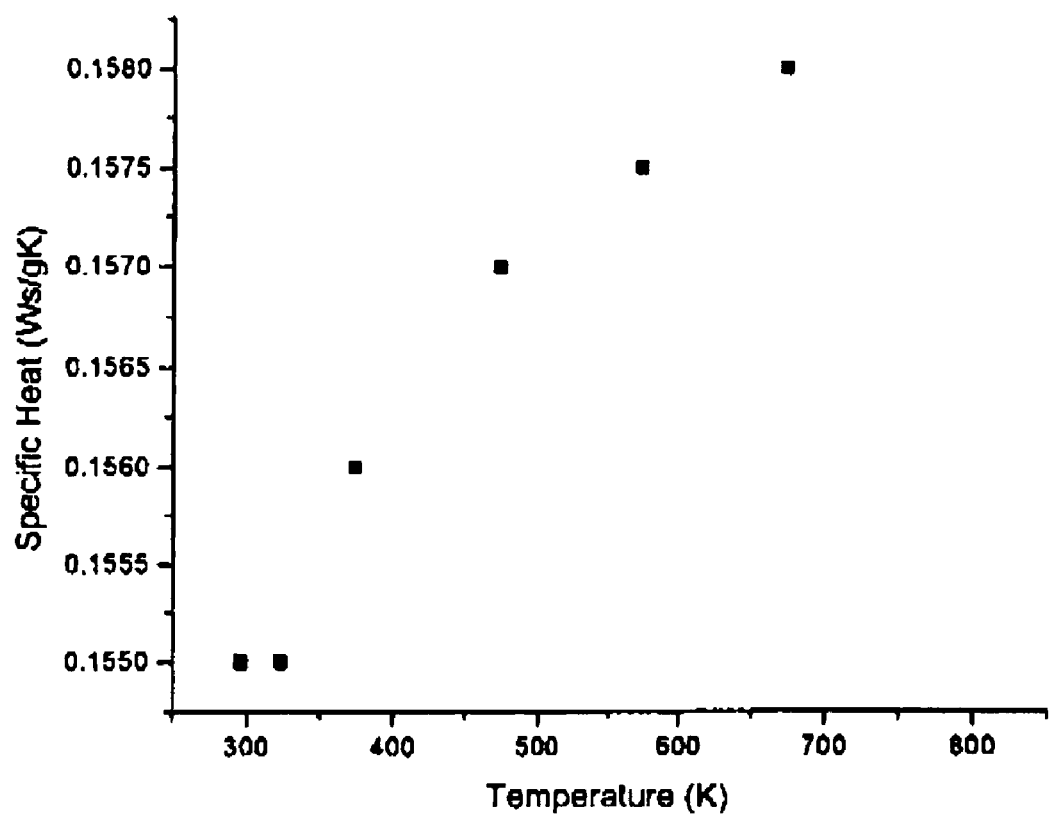

Figure 3/4
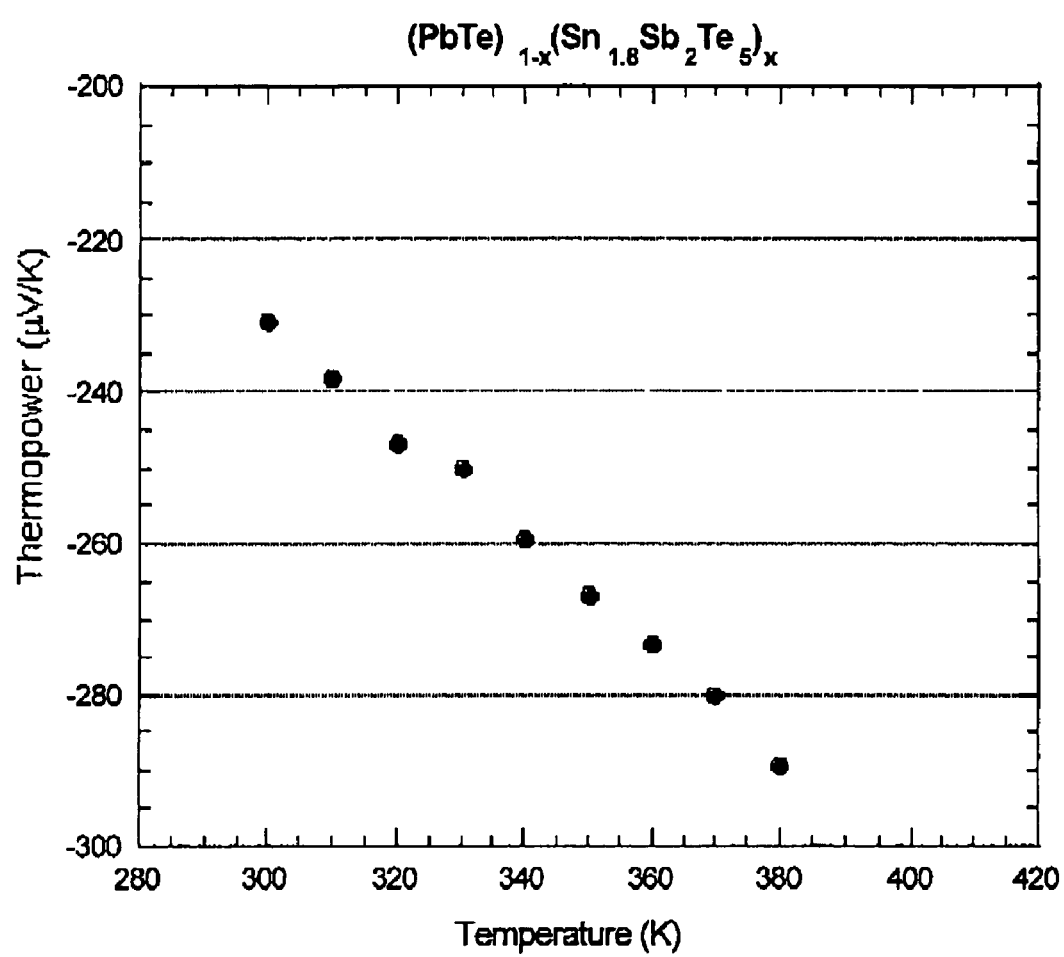

Figure 4/1:
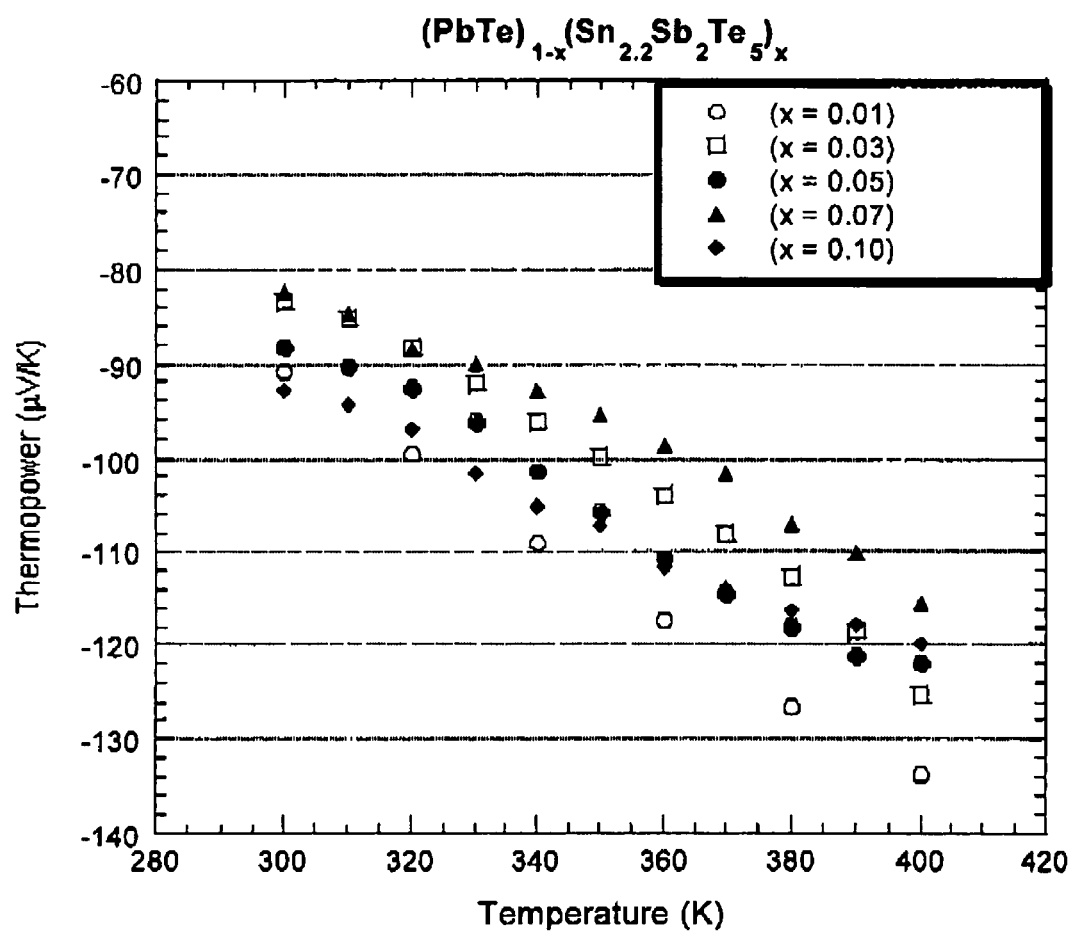

Figure 4/2: High Temperature Measurements
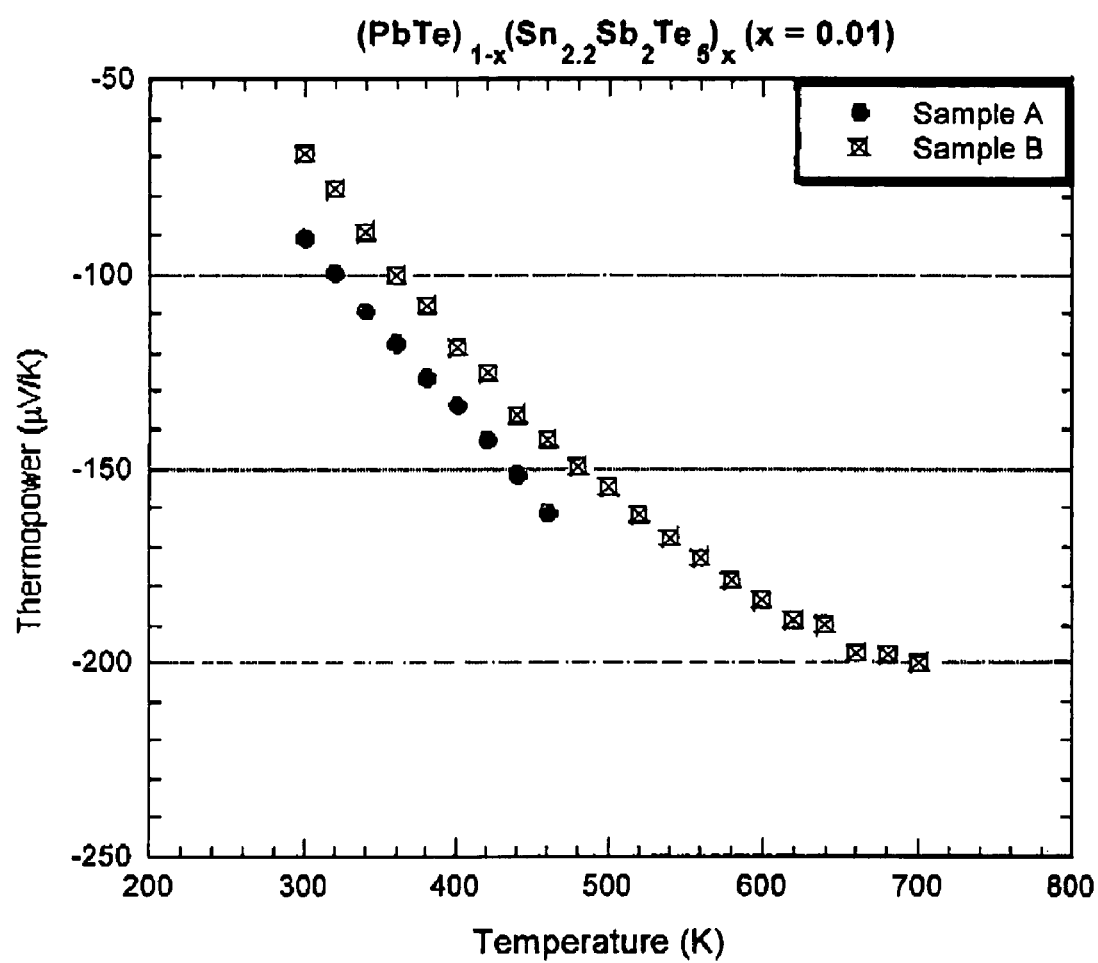

Figure 6/1:
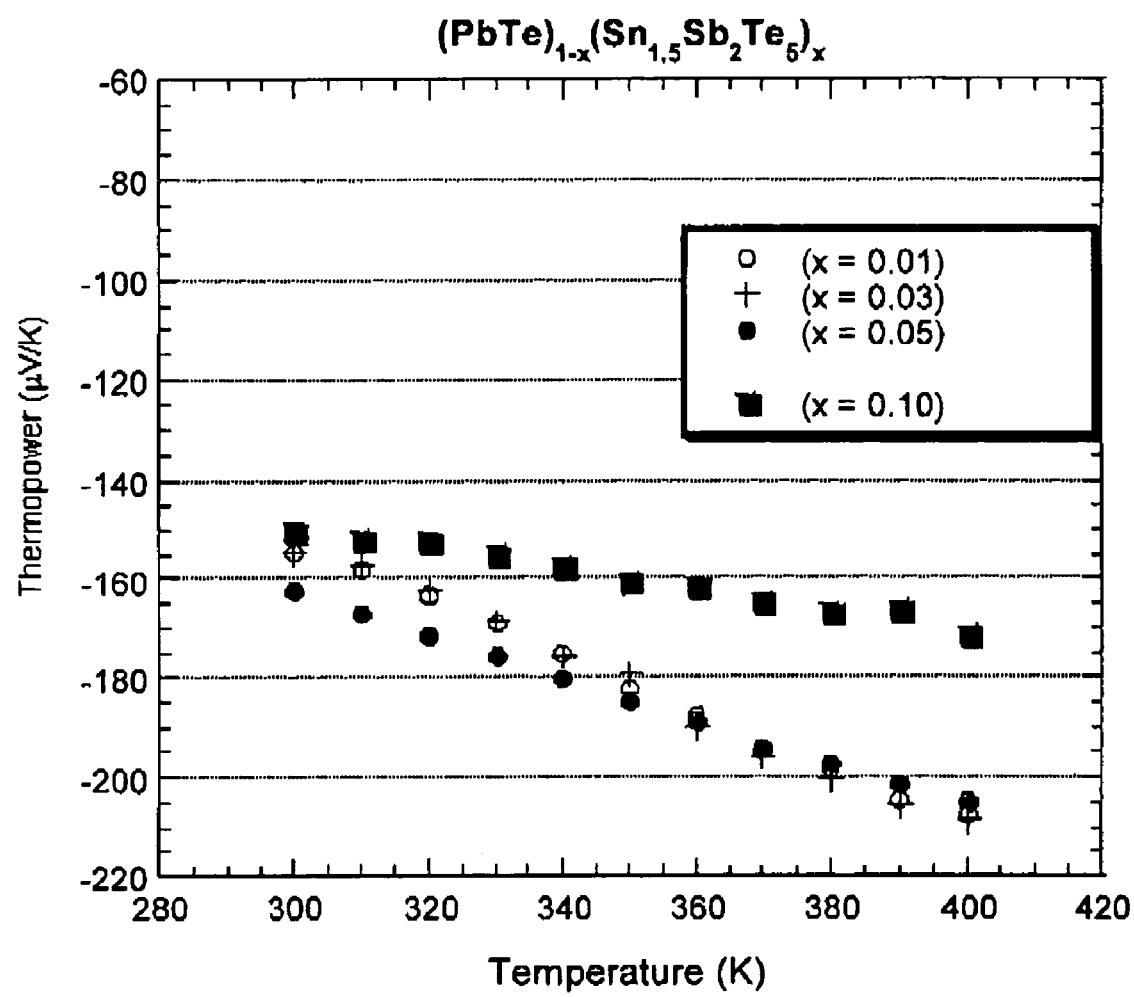

Figure 6/2: High Temperature Measurements
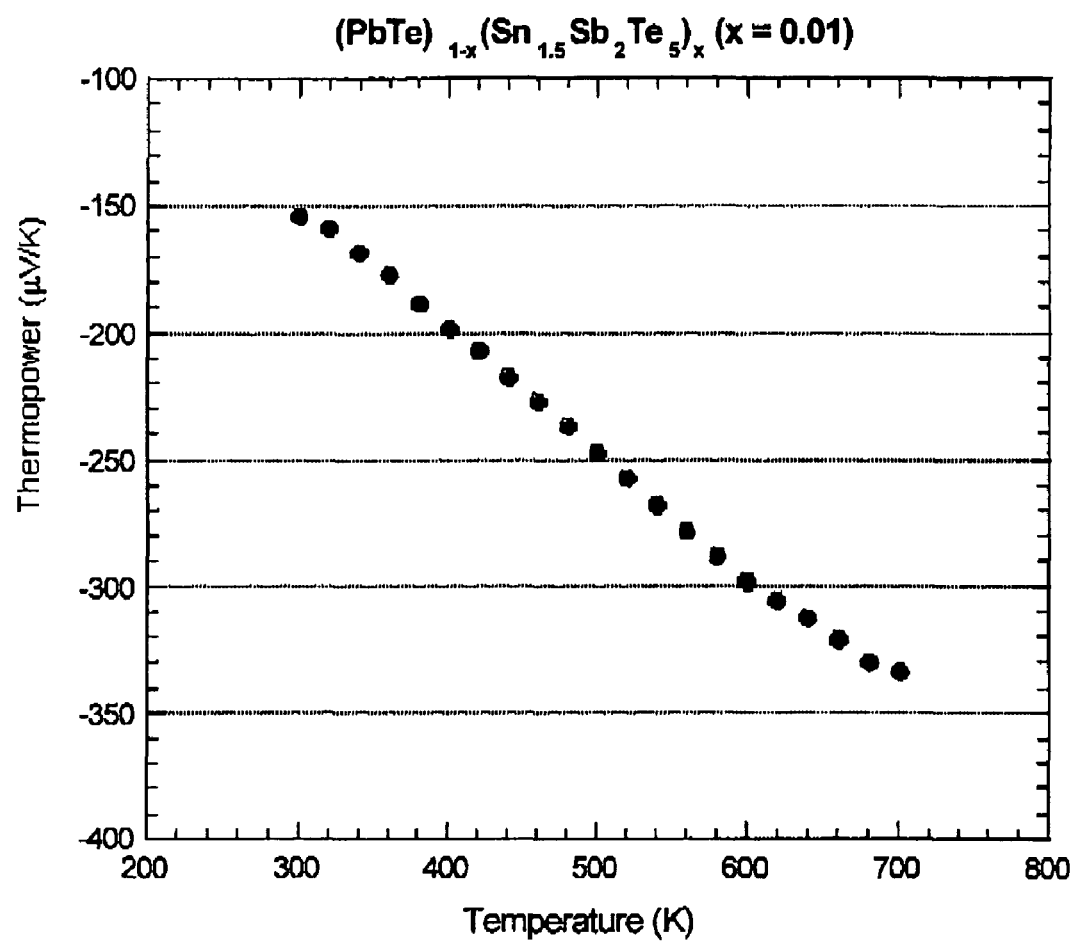

PB-TE-COMPOUNDS DOPED WITH TIN-ANTIMONY-TELLURIDES FOR THERMOELECTRIC GENERATORS OR PELTIER ARRANGEMENTS

DESCRIPTION

The invention relates to Pb—Te-compounds (Pb-tellurides) doped with tin-antimony-tellurides as thermoelectrically active materials, as well as to generators and Peltier arrangements containing them.

Thermoelectric generators per se have been known for a long time, p- or n-doped semiconductors, which are heated on one side and are cooled on the other side, trans-port electrical charges through an external circuit, with electrical work being done at a load in the circuit. The efficiency achieved in this case for the conversion of heat into electrical energy is limited thermodynamically by the Carnot efficiency. For instance, with a temperature of 1000 K on the hot side and 400 K on the "cold" side, an efficiency of (1000−400):1000=60% would be possible. Unfortunately, efficiencies of only up to 10% have been achieved to date.

On the other hand, if a direct current is applied to such an arrangement, then heat will be transported from one side to the other. Such a Peltier arrangement works as a heat pump and is therefore suitable for the cooling of equipment parts, vehicles or buildings. Heating by means of the Peltier principle is also more favorable than conventional heating, because the quantity of heat transported is always greater than the conventional heat that corresponds to the energy equivalent which is supplied.

A good review of effects and materials is given e.g. by Cronin B. Vining, ITS Short Course on Thermoelectricity, Nov. 8, 1993, Yokihama, Japan.

Thermoelectric generators are currently used in space probes for the generation of direct currents, for the cathodic corrosion protection of pipelines, for the energy supply of lighted and radio buoys, and for the operation of radios and television sets. The advantages of thermoelectric generators are that they are extremely reliable, they work irrespective of atmospheric conditions such as humidity, and no material transport susceptible to disruption takes place, instead only charge transport; the fuel is burned continuously—and catalytically without a free flame—so that minor amounts of $CO_1$ $NO_x$ and unburned fuel are released: it is possible to use any fuels from hydrogen through natural gas, gasoline, kerosene and diesel to biologically produced fuels such as rape-seed oil methyl ester.

Thermoelectric energy conversion therefore fits in extremely flexibly with future requirements such as hydrogen economy or energy production from regenerative energies.

An especially attractive application could involve use for conversion into electrical energy in electrically powered vehicles. No modification to the existing network of the fueling stations would need to be carried out. For such an application, however, efficiencies in excess of 30% would be necessary.

The conversion of solar energy directly into electrical energy could also be very attractive. Concentrators such as parabolic collectors can focus the sun's energy with efficiencies of 95-97% onto thermoelectric generators, so that electrical energy can be produced.

Higher efficiencies, however, are necessary for use as a heat pump.

It is an object of the present invention to provide thermoelectric active materials which permit higher efficiencies than previously. A characteristic of thermoelectric materials is the so-called Z factor (figure of merit).

$$Z = \frac{S^2 \cdot \sigma}{K}$$

with S being the Seebeck coefficient, σ being the electrical conductivity and K being the thermal conductivity. The term $S_2 \cdot \sigma$ is the so-called power factor and comprises all electrical parts of the thermoelectric figure of merit.

A more accurate analysis is the efficiency as η

$$\eta = \frac{T_{high} - T_{low}}{T_{high}} \cdot \frac{M - 1}{M + \frac{T_{low}}{T_{high}}}$$

with $M=[1+Z/2(T_{high}+T_{low})]^{1/2}$ (ef. Mat. Sci. and Eng. B29 (1995) 228).

The aim is therefore to provide a material having a maximally high value for Z and high achievable temperature difference. In terms of solid-state physics, many problems need to be overcome in this case:

A high σ entails high electron mobility in the material; i.e. electrons (or holes in the case of p-conducting materials) must not be strongly bound to the atom rumps. Materials having a high electrical conductivity usually also have a high thermal conductivity (Wiedemann-Franz law), so that Z cannot be favorably influenced. Currently used materials such as $Bi_2Te_3$, PbTe or SiGe indeed represent compromises. For instance, the electrical conductivity is reduced less than the thermal conductivity by alloying. It is therefore preferable to use alloys such as e.g. $(Bi_2Te_3)_{90}(Sb_2Te_3)_5(Sb_2Se_3)_5$ or $Bb_2Sb_{23}Te_{65}$, as are described in U.S. Pat. No. 5,448,109.

For thermoelectric materials with high efficiency, it is also preferable to satisfy further constraints. Above all, they must be thermally stable so that they can work for years without substantial loss of efficiency at working temperatures of up to 1000 K. This en-tails phases which per se are stable at high temperatures, a stable phase composition, as well as negligible diffusion of alloy constituents into the adjoining contact materials and vice versa.

The recent patent literature contains descriptions of thermoelectric materials, for example U.S. Pat. No. 6,225,550 and EP-A-1 102 334. U.S. Pat. No. 6,225,550 relates essentially to materials constituted by $Mg_xSb_{z1}$ which are additionally doped with a further element, preferably a transition metal.

EP-A-1 102 334 discloses p- or n-doped semiconductor materials which represent an at least ternary material constituted by the material classes: silicides, borides, germanides, tellurides, sulfides and selenides, antimonides, plumbides and semiconducting oxides.

DE-A-101 42 624 relates to a thermoelectric generator of Peltier arrangement having a thermoelectrically active semiconductor material constituted by a plurality of metals or metal oxides, wherein the thermoelectrically active material is selected from a p- or n-doped ternary compound as semiconductor material. Specifically, compounds of the general formula $Me_xS^A{}_yS^B{}_z$ are disclosed with $S^A{}_y$=Ge and $S^B{}_z$=Te. Lead is not disclosed as a possible metal component.

WO 20041090998 relates to new thermoelectric materials in the system $Pb_{1-x}Ge_xTe$ and describes dopants to yield p- or n-doped semiconductor materials.

There is nevertheless still a need for thermoelectrically active materials which have a high efficiency and exhibit a suitable property profile for different application fields. Research in the field of thermoelectrically active materials can by no means yet be regarded as concluded, so that there is still a demand for different thermoelectric materials.

BRIEF DESCRIPTION OF THE DRAWINGS

FIG. 1/1 shows the Seebeck coefficient S for Example 1;
FIG. 1/2 shows the Seebeck coefficient S for Example 1;
FIG. 2/1 shows the Seebeck coefficient S for Example 2;
FIG. 2/2 shows the Seebeck coefficient S for Example 2;
FIG. 3/1 shows the thermal conductivity coefficient S for Example 3;
FIG. 3/2 shows the thermal diffusivity coefficient S for Example 3;
FIG. 3/3 shows the specific heat S for Example 3;
FIG. 3/4 shows the Seebeck coefficient S for Example 3;
FIG. 4/1 shows the Seebeck coefficient S for Example 4;
FIG. 4/2 shows the Seebeck coefficient S for Example 4;
FIG. 6/1 shows the Seebeck coefficient S for Example 6;
FIG. 6/2 shows the Seebeck coefficient S for Example 6.

Figure 5:
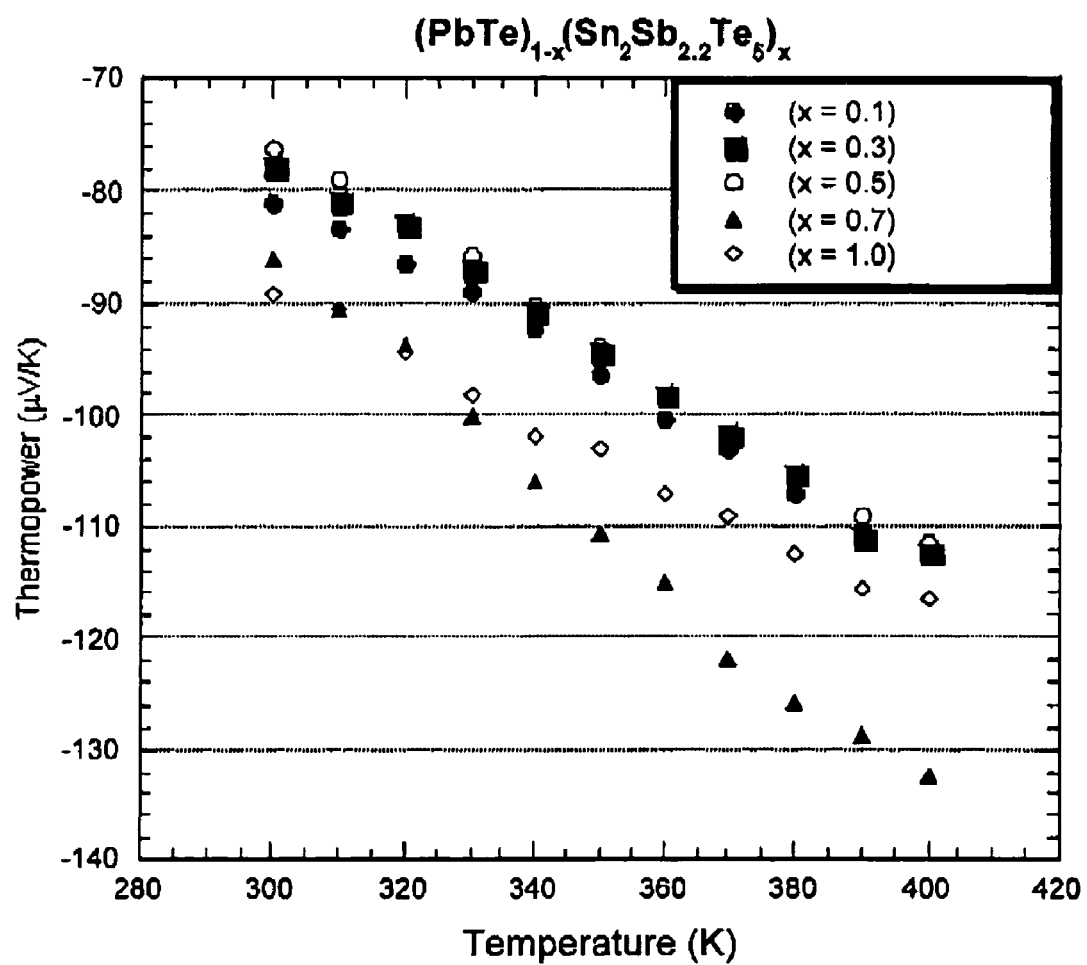
FIG. 5 shows the Seebeck coefficient S for Example 5.

We have found that this object is achieved by a thermoelectrically active p- or n-conductive semiconductor material constituted by a compound of the general formula (I)

$$(PbTe)_{1-x}(Sn_{2\pm y}Sb_{2\pm z}Te_5)_x \qquad (I)$$

with x value from 0.0001 to 0.5, y value from 0 to 2 and z value from 0 to 2, wherein 0 to 10% by weight of the compound may be replaced by other metals or metal compounds, wherein the semiconductor material has a Seebeck coefficient of at least $|S| \geq 60$ µV/K at a temperature of 25° C. and an electrical conductivity of at least 150 S/cm and power factor of at least 5 µW/(cm·K$^2$) as well as a thermoelectric generator or a Peltier arrangement having this thermoelectrically active semiconductor material.

Preferably, the Seebeck coefficient is at least $|S| \geq 80$ µV/K, especially preferred at least $|S| \geq 100$ µV/K. Preferably, the electrical conductivity is at least 500 S/cm, especially preferred at least 2000 S/cm. Preferably, the material has a power factor of at least 10 µW/(cm·K$^2$), especially preferred at least 15 µW/(cm·K$^2$).

Preferably, in the compound of the general formula (I) x is a value from 0.0001 to 0.1, especially preferred from 0.0001 to 0.05. Particularly preferred is a value x of about 0.02. This value of 0.02 corresponds to a composition (PbTe)$_{0.98}$ (Sn$_{2\pm y}$Sb$_{2\pm z}$Te$_5$)$_{0.02}$.

In the semiconductor material according to the present invention 0 to 10% by weight, preferably 0 to 5% by weight, especially 0 to 1% by weight of the compound may be replaced by other metals or metal compounds which also may act as p- or n-dopants. Examples for other metals or metal compounds are Na, K, Mg, Mn, Fe, Co, Ni, Cu, Ag, TI, Si, Ge, As, BI, S, Se, Pb-halides, Sb-halides, Bi-halides, Sb-tellurides, 81-tellurides, and mixtures thereof.

According to one embodiment of the present invention, 0.05 to 1% by weight, more preferably 0.1 to 0.5% by weight of the compound of the general formula (I) are re-placed by dopants. These dopants are preferably selected from the group consisting of Bi, Se, Ge or As. One specific example of a dopant is Bi which is preferably employed in an amount of from 0.1 to 0.5% by weight, based on the semiconductor material. Other possible dopants are known to the person skilled in the art. The dopants and the other metals or metal compounds are selected in a way that the Seebeck coefficient, the electrical conductivity and the power factor of the material are preferably not adversely affected.

The semiconductor materials of the present invention are prepared by melting together mixtures of the element powders of the constituents or of alloys thereof for at least 1 hour and subsequently cooling the melt to a temperature which is at least 100° C. lower than the melting point of the semiconductor material. Subsequent annealing of the semiconductor material at a temperature which is at least 100° C. lower than the melting point of the semiconductor material for at least 1 hour is often beneficial.

The melting together in the first reaction stage is preferably performed for at least 2 hours, more preferably at least 5 hours, most preferably at least 10 hours. The melting together may be performed with or without mixing of the melt. For example, the melt can be mixed using a rocking furnace to ensure the composition homogeneity. The time required for the melting together is dependent on the mixing of the components. If no mixing is performed, longer times for melting together are required to obtain a homogeneous material, whereas under good mixing conditions the homogeneity is obtained after shorter hours.

Without additional mixing a typical time for melting is from 2 to 50 hours.

The melting is performed at a temperature at which at least one of the components is molten and the semiconductor material or mixture is present in a molten state. For example, the temperature is at least 900° C., preferably at least 950° C. Typically, the temperature is in the range of from 800 to 1200° C., preferably from 1000 to 1100° C.

In one embodiment of the present invention, the molten mixture is cooled at a rate of at least 50 K/h, preferably at least 100 K/h, more preferably at least 150 K/h. In another embodiment of this invention, after melting together the (homogeneous) molten mixture is rapidly cooled at a rate of at least 10 K/s, preferably at least 20 K/s, more preferably at least 100 K/s. The cooling is performed to a temperature which is at least 100 K lower than the melting point of the semiconductor material, preferably at least 200 K lower, more preferably at least 500 K lower than the melting point of the semiconductor material. In a preferred embodiment the melt is rapidly cooled to room temperature (25° C.) or lower temperatures. For example the melt can be rapidly cooled by introducing it in an ice-water mixture or into oil, liquefied N$_2$, liquefied NH$_3$, SO$_2$, (halogenated) alkanes or other inert liquids or gases. Other ways of rapidly cooling the melt are known to the person skilled in the art. Preferably, pressure is applied to the mixture upon cooling, e.g. from 50 to 10000 bar.

After rapidly cooling (quenching) the melt, the semiconducting material can be annealed at a temperature which is at least 100 K, preferably at least 200 K lower than the melting point of the semiconductor material. A typical temperature can be in the range of from 450 to 650° C., preferably 500 to 600° C. The annealing is performed for at least 1 hour, more preferably at least 2 hours, more preferably at least 10 hours. A typical time would be in the range of from 10 to 250 hours, more preferably 20 to 100 hours. In atypical embodiment the annealing is performed at a temperature which is 100 to 500 K lower than the melting point of the semiconductor material. A preferred temperature range is from 150 to 350 K lower than the melting point of the semiconductor material.

In a specific process, the melt is rapidly cooled at a rate of at least 20 K/s to a temperature of 25° C. or lower and the semiconductor material is subsequently annealed at a temperature which is at least 150 K lower than the melting point of the semiconductor material for at least 5 hours.

Without being bound to any theory, it is assumed that the annealing process is responsible for obtaining the high thermoelectric values in the semiconductor material of the present invention.

In a very specific embodiment the elements were reacted for one day at 1050° C. in a quartz tube. Subsequently, the quartz-tube was immediately immersed in ice water. Subsequently, the material was annealed at 550° C. for seven days.

According to the state of the art, materials like $Bi_2Te_3$ or PbTe are produced by melting and reacting the components in a heated quartz tube. Mixing may be enhanced by rocking the heating furnace. After the reaction is completed the furnace is cooled down. Afterwards the quartz tube is removed and the thermoelectric material in the form of an ingot is cut into slices. These slices are sawn into the pieces of 3-5 mm length from which the thermoelectric module is built up.

In another technique the cooled material may be ground at ambient temperature to typical particle sizes lower than 10 μm. The ground material is pressed to parts having the desired shape. The apparent density of those pressed parts should exceed 50%, preferably 80%, of the bulk density of the material. Substances that improve the densification by pressing may be added in amounts of 0.1 to 5 Vol.-%, preferably 0.2 to 2 Vol.-% of the powdered material. Those additives must of course be inert to the thermoelectric material and vanish upon heating under inert conditions or in vacuum at temperatures below the sintering temperature. After pressing, the pressed parts are put into a sintering furnace where they are heated to a temperature up to 20 K below the melting point. Thus the pressed parts are sintered to 95% to 100% of their theoretical (bulk) density.

In order to prevent the generation of flaws or cracks by quenching the molten material it is proposed to apply processes that result in good thermal contact during the quenching procedure and, more preferred, additionally allow for quenching and application of pressure simultaneously during the cooling. In one design/embodiment of the invention the melt, staying at a temperature above the melting point, is injected into molds or cases yielding the final measures for the application, pressure die casting, a technology as it is for example used in the field of aluminum, magnesium or zinc pressure die casting. Thus the small thermoelectrically active parts are directly prepared in the right dimensions, ready to use. By this procedure the parts are quenched more rapidly than within a quartz tube because the ratio of surface that is effective for cooling compared to the volume of the parts is increased drastically compared to the case of the quartz tube. The applied pressure, preferably in the range of 10 to 1000 bars, counteracts the generation of flaws or cracks. The material is compressed on cooling and the outer layers are pressed against the core of the material. Since the volume is small com-pared to the volume of the overall ingot the absolute mechanical stresses on quenching are smaller.

It is also possible to run a continuous process by pouring the melt into a cooling channel with dimensions according to the width and height of the final parts. The material solidifies within this channel. The solidified material (in the form of a bar) is removed from the channel by a plunger and transferred into a pressing mold which smoothly covers the bar and further cools it down. This process is well known in metals processing as continuous casting. In a preferred embodiment of the invention the melt is poured into the rectangular channel that is made up between two profiled and chilled rollers. These consist of a material of high thermal conductivity.

The material is continuously quenched under increasing pressure, e.g., in the pressure range indicated above. The continuously produced bars are cut into the final parts, The present invention also relates to a semiconductor material prepared by the above process.

Furthermore, the present invention relates to a thermoelectric generator of Peltier arrangement having a thermoelectrically active p- or n-conductive semiconductor material as defined above.

The thermoelectric generators and Peltier arrangements according to the invention enhance quite generally, on the one hand, the range of available thermoelectric generators and Peltier arrangements. Owing to the different chemical systems, it is possible to satisfy different requirements in various application fields of the thermoelectric generator or Peltier arrangements. The thermoelectric generators and Peltier arrangements according to the invention hence significantly extend the possibilities for application of these elements under different conditions.

The proportion of doping elements is from $10^{18}$ to $10^{20}$ charge carriers per cubic centimeter. Higher charge-carrier concentrations cause disadvantageous effects, and hence a reduced charge mobility.

A further possible way of doping is obtained if holes or electrons are deliberately introduced into the materials by means of super- or sub-stoichiometric compositions, which obviates the need for an additional doping step.

Preferably, the p- or n-doping is carried out through selection of the stoichiometric parameters y, z, and x, respectively.

The materials according to the invention are introduced into modules, as described e.g. in WO 98/44562, U.S. Pat. No. 5,448,109, EP-A-1 102 334 or U.S. Pat. No. 5,439,528, and these modules are connected in series.

The invention is further illustrated by the following examples:

EXAMPLE 1

Elemental powders in amounts corresponding to the formula $(PbTe)_{1-x}(Sn_2Sb_2Te_5)_x$, x=0.01 to 0.05 (y=0, z=0), were introduced in a quartz tube. The total amount of material was about 5.2 g, Instead of a quartz tube all other inert materials may be employed in the melting process.

Preparation: $Sn_2Sb_2Te_5$ was made by melting/quenching stoichiometric amounts of the elements. A mixture of PbTe and $Sn_2Sb_2Te_5$ (total ~5.2 g each reaction) was heated to 950° C. over 10 h and stayed there for 6 h, followed by rocking for 1 h at the rate 5 (fast). The melts were slowly cooled to 50° C. over 24 h.

Quality of the product ingots: The obtained ingots were pretty solid but a few micro-cracks were found when they were cut. The cracks were not as serious as in the quenched ingots.

All ingots were cut to disks of approximately 5 mm thickness using a wire saw and further cut to a rectangular shape for the property measurements. A 5 mm thick disk type sample was used for characterization.

The electrical resistance was measured at room temperature with a 4-probe instrument, which is a well-known technique.

The electrical conductivity was up to 3480 S/cm.

Electrical conductivity:

| Sample | x | Conductivity |
|---|---|---|
| 1a | 0.01 | 3482 |
| 1b | 0.02 | 3458 |
| 1c | 0.03 | 2488 |

| Sample | x | Conductivity/ S cm$^{-1}$ |
|---|---|---|
| 1d | 0.04 | 2381 |
| 1e | 0.05 | 1152 |

The Seebeck coefficient S (thermopower) is shown in FIG. 1/1 and 1/2.

Thus, power factors in the range from 13.8 to 17.2 µW/(cm·K$^2$) were obtained.

Power Factor:

| Sample | x | Power factor/ µW cm$^{-1}$ K$^{-2}$ |
|---|---|---|
| 1a | 0.01 | 17.2 |
| 1b | 0.02 | 15.3 |
| 1c | 0.03 | 13.8 |
| 1d | 0.04 | 15.9 |
| 1e | 0.05 | 16.8 |

The stoichiometric composition of Sn2Sb2Te5 created n-type materials for all doping levels. The electrical conductivities are substantially high.

EXAMPLE 2

The same process as described in example 1 was carried out for $(PbTe)_{1-x}(Sn_{1.8}Sb_2Te_5)_x$, x=0.01 to 0.10.

Preparation: $Sn_{1.8}Sb_2Te_5$ was made by melting/quenching stoichiometric amounts of the elements. A mixture of PbTe and $Sn_{1.8}Sb_2Te_5$ (total ~5.5 g each reaction) was heated to 950° C. over 10 h and stayed there for 6 h, followed by rocking for 1 h. The melts were slowly cooled to 50° C. over 24 h.

All ingots were sliced at about 5 mm thickness using a diamond blade saw and each sliced disk was cut to a rectangular shape for property measurements.

Electrical conductivity:

| Sample | X | Conductivity/ S cm$^{-1}$ |
|---|---|---|
| 2a | 0.01 | 820 |
| 2b | 0.03 | 729 |
| 2c | 0.05 | 237 |
| 2d | 0.07 | 194 |

The Seebeck coefficient S (thermopower) is shown in FIG. 2/1 and 2/2.

Power Factor:

| Sample | x | Power factor/ µW cm$^{-1}$ K$^{-2}$ |
|---|---|---|
| 2a | 0.01 | 27.2 |
| 2b | 0.03 | 19.1 |
| 2c | 0.05 | 6.8 |
| 2d | 0.07 | 6.3 |

The $Sn_{1.8}Bb_2Te_5$ at all doping levels created n-type materials. The electrical conductivities are lower than those of the materials doped with $Sn_2Sb_2Te_5$ and decrease as doping level increases. All materials showed twice or three times higher thermopower than the $Sn_2Sb_2Te_5$ doped materials of example 1.

EXAMPLE 3

High temperature thermal conductivity measurement on samples of the composition $(PbTe)_{0.99}(Sn1.8Sb_2Te_5)_{0.01}$.

Preparation: A mixture of PbTe and $Sn_{1.8}Sb_2Te_5$ (total ~125 g) was heated to 1000° C. over 10 h and then stayed there for 24 h. After being shaken several times at 1000° C., the tube was cooled to 50° C. over 10 h. The obtained ingot was cut to slices and conductivity measurements were performed.

Results at room temperature:

Electrical conductivity: 600 S/cm (several micro-pores observed)

Seebeck coefficient S (thermopower): −230.8 µV/K

Power factor: 31.9 µW/(cm·K$^2$)

Measured thermal conductivities (see FIG. 3/1-3/3):

| Temperature/ K | Specific Heat/ W s g$^{-1}$ K$^{-1}$ | Diffusivity/ cm$^2$ s$^{-1}$ | Thermal conductivity/ W K$^{-1}$ cm$^{-1}$ |
|---|---|---|---|
| 296 | 0.155 | 0.0131 | 01531 |
| 323 | 0.155 | 0.0126 | 0.01472 |
| 373 | 0.156 | 0.0115 | 0.01353 |
| 473 | 0.157 | 0.0096 | 0.01130 |
| 573 | 0.158 | 0.0082 | 0.00976 |
| 673 | 0.158 | 0.0080 | 0.00947 |

The Seebeck coefficient S (thermopower) is shown in FIG. 3/4.

EXAMPLE 4

The same process as described in example 1 was carried out for $(PbTe)_{1-x}(Sn_{2.2}Sb_2Te_5)_x$, x=0.01 to 0.10.

Preparation: $Sn_{2.2}Sb_2Te_5$ was made by melting/quenching stoichiometric amounts of the elements. A mixture of PbTe and $Sn_{2.2}Sb_2Te_5$ (total ~5.5 g each reaction) was heated to 950° C. over 10 h and stayed there for 6 h, followed by rocking for 6 h. The melts were slowly cooled to 50° C. over 24 h.

All ingots were sliced to disks using a diamond blade saw and each disk was cut to a rectangular shape for property measurements.

Electrical conductivity:

| Sample | x | Conductivity/ S cm$^{-1}$ |
|---|---|---|
| 4a | 0.01 | 2153 |
| 4b | 0.03 | 1833 |
| 4c | 0.05 | 1336 |
| 4d | 0.07 | 1028 |
| 4e | 0.10 | 613 |

The Seebeck coefficient S (thermopower) is shown in FIG. 4/1 and 4/2.

Power Factor:

| Sample | x | Power factor/ μW cm$^{-1}$ K$^{-2}$ |
|---|---|---|
| 4a | 0.01 | 17.8 |
| 4b | 0.03 | 12.6 |
| 4c | 0.05 | 10.3 |
| 4d | 0.07 | 6.9 |
| 4e | 0.10 | 5.3 |

In comparison with $Sn_{1.8}Sb_2Te_5$ doped materials, the electrical conductivities are higher at all doping levels and systematically decrease from 2153 to 613 S/cm as doping level increases from 0.01 to 0.10. On the other hand, thermopower shows a very small variation (82 to 93 μV/K at room temperature) at all doping levels examined.

EXAMPLE 5

The same process as described in example 1 was carried out for $(PbTe)_{1-x}(Sn_2Sb_{2.2}Te_5)_x$, x=0.01 to 0.10.

Preparation: $Sn_2Sb_{2.2}Te_5$ was made by melting/quenching stoichiometric amounts of the elements. A mixture of PbTe and $Sn_2Sb_{2.2}Te_5$ (total ~5.2 g each reaction) was heated to 1050° C. over 10 h and stayed there for 6 h, followed by rocking for 2 h. The melts were slowly cooled to 50° C. over 10 h.

All ingots were cut to disks using a diamond-blade saw and each disk was cut using a wire-blade saw to a rectangular shape for the property measurements.

Electrical conductivity:

| Sample | x | Conductivity/ S cm$^{-1}$ |
|---|---|---|
| 5a | 0.01 | 2963 |
| 5b | 0.03 | 2844 |
| 5c | 0.05 | 1676 |
| 5d | 0.07 | 1150 |
| 5e | 0.10 | 819 |

The Seebeck coefficient S (thermopower) is shown in FIG. 5.

Power Factor:

| Sample | x | Power factor/ μW cm$^{-1}$ K$^{-2}$ |
|---|---|---|
| 5a | 0.01 | 19.4 |
| 5b | 0.03 | 17.2 |
| 5c | 0.05 | 9.8 |
| 5d | 0.07 | 8.5 |
| 5e | 0.10 | 6.5 |

In comparison with $(PbTe)_{1-x}(Sn_{2.2}Sb_2Te_5)_x$, the materials gained conductivity but slightly lost the thermopower, which ends up with a slight increase of power factor with the values shown above.

EXAMPLE 6

The same process as described in example 1 was carried out for $(PbTe)_{1-x}(Sn_{1.5}Sb_2Te_5)_x$, x=0.01 to 0.10.

Preparation: $Sn_{1.5}Sb_2Te_5$ was made by melting/quenching stoichiometric amounts of the elements. A mixture of PbTe and $Sn_{1.5}Sb_2Te_5$ (total ~5.2 g each reaction) was heated to 1050° C. over 10 h and stayed there for 6 h, followed by rocking for 2 h. The melts were slowly cooled to 50° C. over 12 h.

All ingots were sliced at about 5 mm thickness using a diamond blade saw and each sliced disk was cut to a rectangular shape for property measurements.

Electrical conductivity:

| Sample | x | Conductivity/S cm$^{-1}$ |
|---|---|---|
| 6a | 0.01 | 830 |
| 6b | 0.03 | 558 |
| 6c | 0.05 | 428 |
| 6d | 0.07 | 198 |
| 6e | 0.10 | 250 |

The Seebeck coefficient S (thermopower) is shown in FIG. 6/1 and 6/2.

Power Factor:

| Sample | x | Power factor/μW cm$^{-1}$ K$^{-2}$ |
|---|---|---|
| 6a | 0.01 | 19.9 |
| 6b | 0.03 | 13.4 |
| 6c | 0.05 | 11.2 |
| 6d | 0.10 | 5.6 |

Despite the grain boundaries clearly shown in the produced ingots, the conductivities measured are moderately high and decreases as doping level increases. The thermopower of the materials with low doping level (x=0.01-0.05) are very similar.

EXAMPLE 7

The same process as described in example 1 was carried out for
$(PbTe)_{1-x}(Sn_2Sb1.5Te_5)_x$, x=0.01 to 0.10.

Preparation: $Sn_2Sb_{1.5}Te_5$ was made by melting/quenching stoichiometric amounts of the elements. A mixture of PbTe and $Sn_2Sb_{1.5}Te_5$ (total ~5.2 g each reaction) was heated to 1050° C. over 10 h and stayed there for 6 h, followed by rocking for 2 h. The melts were slowly cooled to 50° C. over 12 h.

All ingots were sliced at about 5 mm thickness using a diamond blade saw and each sliced disk was cut to a rectangular shape for property measurements.
Electrical conductivity:

| Sample | x | Conductivity/S cm$^{-1}$ |
|---|---|---|
| 7a | 0.01 | 428 |
| 7b | 0.03 | 335 |
| 7c | 0.05 | 221 |
| 7d | 0.07 | 154 |

Figure 7:
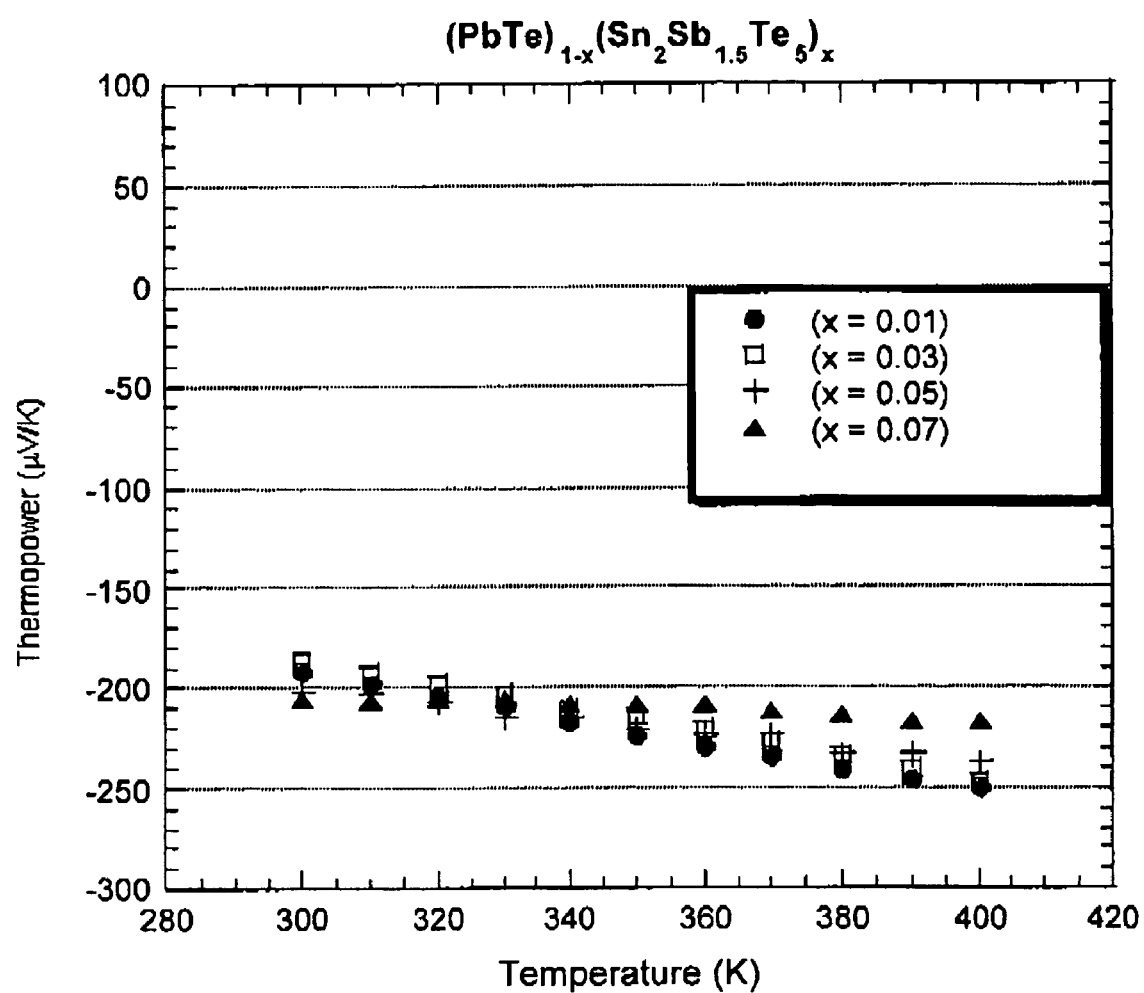
FIG. 7 shows the Seebeck coefficient S for Example 7.

The Seebeck coefficient S (thermopower) is shown in FIG. 7.
Power Factor:

| Sample | x | Power factor/μW cm$^{-1}$ K$^{-2}$ |
|---|---|---|
| 7a | 0.01 | 15.8 |
| 7b | 0.03 | 11.7 |
| 7c | 0.05 | 9.0 |
| 7d | 0.07 | 6.5 |

The $Sn_2Sb_{1.5}Te_5$ doped materials showed a significant decrease in the conductivity by one half compared to the $Sn_{1.5}Sb_2Te_5$ doped materials and the same trend of decreasing conductivity as a function of doping level.

We claim:

1. A thermoelectrically active p- or n-type semiconductor material consisting of:
a compound of the general formula (I)

$$(PbTe)_{1-x}(Sn_Q Sb_R Te_5)_x \quad (I)$$

wherein $0.01 \leq x \leq 0.5$, $1.5 \leq Q \leq 2.2$, and $1.5 \leq R \leq 2.2$, and 0-10% by weight of a dopant, wherein the dopant is selected from the group consisting of Na, K, Mg, Mn, Fe, Co, Ni, Tl, Si, Ge, As, Bi, S, Se, Pb-halides, Sb-halides, Bi-halides, Sb-tellurides, Tl-tellurides, and mixtures thereof.

2. A semiconductor material according to claim 1, wherein $0.0001 \leq x \leq 0.1$.

3. A semiconductor material according to claim 1, wherein $0.0001 \leq x \leq 0.05$.

4. A semiconductor material according to claim 1, wherein x is about 0.02.

5. A semiconductor material according to claim 1, comprising a compound of the formula $$(PbTe)_{1-x}(Sn_2 Sb_2 Te_5)_x$$

wherein x is from 0.01 to 0.05.

6. A semiconductor material according to claim 1, comprising a compound of the formula $$(PbTe)_{1-x}(Sn_{1.8} Sb_2 Te_5)_x$$

wherein x is from 0.01 to 0.1.

7. A semiconductor material according to claim 1, comprising a compound of the formula $$(PbTe)_{1-x}(Sn_{2.2} Sb_2 Te_5)_x$$

wherein x is from 0.01 to 0.1.

8. A semiconductor material according to claim 1, comprising a compound of the formula $$(PbTe)_{1-x}(Sn_2 Sb_{2.2} Te_5)_x$$

wherein x is from 0.01 to 0.1.

9. A semiconductor material according to claim 1, comprising a compound of the formula $$(PbTe)_{1-x}(Sn_{1.5} Sb_2 Te_5)_x$$

wherein x equals 0.01 to 0.1.

10. A semiconductor material according to claim 1, comprising a compound of the formula $$(PbTe)_{1-x}(Sn_2 Sb_{1.5} Te_5)_x$$

wherein x equals 0.01 to 0.1.

11. A semiconductor material according to claim 1, comprising 0 to 5% by weight of the dopant.

12. A semiconductor material according to claim 1, comprising 0 to 1% by weight of the dopant.

13. A semiconductor material according to claim 1, comprising 0.05 to 1% by weight of the dopant.

14. A semiconductor material according to claim 1, comprising 0.1 to 0.5% by weight of the dopant.

15. A semiconductor material according to claim 13, wherein the dopant is selected from the group consisting of Bi, Se, Ge, As, and mixtures thereof.

16. A semiconductor material according to claim 15, comprising 0.1 to 0.5% by weight Bi.

17. A semiconductor material according to claim 1, wherein the material is characterized by a Seeback coefficient |S| that is greater than or equal 60 μV/K at a temperature of 25° C., an electrical conductivity of at least 150 S/cm, or a power factor of at least 5 μW/(cm·K$^2$).

18. A semiconductor material according to claim 17, wherein the Seeback coefficient |S| is greater than or equal 80 μV/K, the electrical conductivity is at least 500 S/cm, or the power factor is at least 10 μW/(cm K$^2$).

19. A semiconductor material according to claim 17, wherein the Seeback coefficient |S| is greater than or equal 100 μV/K, the electrical conductivity is at least 2000 S/cm, or the power factor is at least 15 μW/(cm·K$^2$).

20. A semiconductor material according to claim 1, wherein the proportion of doping elements is from $10^{18}$ to $10^{20}$ charge carriers per cubic centimeter.

21. A thermoelectric generator or Peltier arrangement comprising a semiconductor material according to claim 1.

22. A thermoelectric generator or Peltier arrangement comprising a semiconductor material according to claim 2.

23. A thermoelectric generator or Peltier arrangement comprising a semiconductor material according to claim 22.

24. A thermoelectric generator or Peltier arrangement comprising a semiconductor material according to claim 17.

25. A thermoelectric generator or Peltier arrangement comprising a semiconductor material according to claim 18.

26. A thermoelectric generator or Peltier arrangement comprising a semiconductor material according to claim 19.

27. A thermoelectric generator or Peltier arrangement comprising a semiconductor material according to claim 20.

28. A thermoelectrically active p- or n-type semiconductor material consisting essentially of:
a compound of the general formula (I)

$$(PbTe)_{1-x}(Sn_Q Sb_R Te_5)_x \quad (I)$$

wherein x is between about 0.01 and 0.1, Q is between about 1.5 and 2.2, and R is between about 1.5 and 2.2; and
0-10% by weight of a dopant, wherein the dopant is selected from the group consisting of Na, K, Mg, Mn, Fe, Co, Ni, Tl, Si, Ge, As, Bi, S, Se, Pb-halides, Sb-halides, Bi-halides, Sb-tellurides, Tl-tellurides, and mixtures thereof.

29. A thermoelectrically active p- or n-type semiconductor material consisting of:
a compound of the general formula (I)

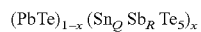 (I)

wherein x is between about 0.01 and 0.5, Q is between about 1.5 and 2.2, and R is about 2; and 0-10% by weight of a dopant, wherein the dopant is selected from the group consisting of Na, K, Mg, Mn, Fe, Co, Ni, Tl, Si, Ge, As, Bi, S, Se, Pb-halides, Sb-halides, Bi-halides, Sb-tellurides, Tl-tellurides, and mixtures thereof.

* * * * *

UNITED STATES PATENT AND TRADEMARK OFFICE
CERTIFICATE OF CORRECTION

| | | |
|---|---|---|
| PATENT NO. | : 7,952,015 B2 | |
| APPLICATION NO. | : 11/392495 | |
| DATED | : May 31, 2011 | |
| INVENTOR(S) | : Sterzel et al. | |

It is certified that error appears in the above-identified patent and that said Letters Patent is hereby corrected as shown below:

ON THE TITLE PAGE:
Item (75) Inventors at line 3, change "Kuehling" to --Kühling--.

ITEM (56) REFERENCES CITED:
On page 3, in column 1, line 3, Under Other Publications, change "Departmen" to --Department--.

On page 3, in column 1, line 4, Under Other Publications, change "Lomonossov" to -- Lomonosov--.

On page 3, in column 1, line 24, Under Other Publications, change "Thermolectrics," to --Thermoelectrics--.

On page 3, in column 1, line 41, Under Other Publications, change "Teraru" to --Ternary--.

On page 3, in column 1, line 49, Under Other Publications, change "Thermoelectrice" to --Thermoelectric--.

On page 3, in column 2, line 58, Under Other Publications, change "(completeion" to --(completion--.

On page 4, in column 1, line 32, Under Other Publications, change "semiconuctor" to --semiconductor--.

On page 4, in column 1, line 59, Under Other Publications, change "Intrinscally" to --Intrinsically--.

On page 4, in column 1, line 67, Under Other Publications, change "Instutitute" to --Institute--.

Signed and Sealed this
Twenty-second Day of May, 2012

David J. Kappos
*Director of the United States Patent and Trademark Office*

CERTIFICATE OF CORRECTION (continued)
U.S. Pat. No. 7,952,015 B2

On page 4, in column 2, line 11, Under Other Publications, change "naostructuring" to --nanostructuring--.

On page 5, in column 1, line 19, Under Other Publications, change "oj" to --of--.

On page 5, in column 1, line 25, Under Other Publications, change "p-tupe" to --p-type--.

On page 5, in column 2, line 22, Under Other Publications, after "Development" change "on" to --of--.

On page 5, in column 2, line 23, Under Other Publications, change "Spacegraft" to --Spacecraft--.

IN THE SPECIFICATIONS:
In column 1 at line 35, change "Yokihama," to --Yokohama,--.

In column 2 at line 26, change "case:" to --case.--.

In column 3 at line 26, change "7;" to --7.--.

In column 6 at line 45, change "5.2 g," to --5.2 g.--.

In column 10 at line 21, change "-5.2 g" to --~5.2 g--.

IN THE CLAIMS:
In column 12 at line 25, in Claim 17, change "Seeback" to --Seebeck--.

In column 12 at line 31, in Claim 18, change "Seeback" to --Seebeck--.

In column 12 at line 33, in Claim 18, change "10 μW/(cm K$^2$})." to --10 μW/(cm·K$^2$).--.

In column 12 at line 35, in Claim 19, change "Seeback" to --Seebeck--.

In column 12 at line 46, in Claim 23, change "claim 22." to --claim 13.--.